(12) United States Patent
Saotome et al.

(10) Patent No.: US 11,069,780 B2
(45) Date of Patent: Jul. 20, 2021

(54) COATING LIQUID FOR FORMING OXIDE, METHOD FOR PRODUCING OXIDE FILM, AND METHOD FOR PRODUCING FIELD-EFFECT TRANSISTOR

(71) Applicants: Ryoichi Saotome, Kanagawa (JP); Naoyuki Ueda, Kanagawa (JP); Yuichi Ando, Hyogo (JP); Yuki Nakamura, Tokyo (JP); Yukiko Abe, Kanagawa (JP); Shinji Matsumoto, Kanagawa (JP); Yuji Sone, Kanagawa (JP); Sadanori Arae, Kanagawa (JP); Minehide Kusayanagi, Kanagawa (JP)

(72) Inventors: Ryoichi Saotome, Kanagawa (JP); Naoyuki Ueda, Kanagawa (JP); Yuichi Ando, Hyogo (JP); Yuki Nakamura, Tokyo (JP); Yukiko Abe, Kanagawa (JP); Shinji Matsumoto, Kanagawa (JP); Yuji Sone, Kanagawa (JP); Sadanori Arae, Kanagawa (JP); Minehide Kusayanagi, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/353,872

(22) Filed: Mar. 14, 2019

(65) Prior Publication Data

US 2019/0288076 A1 Sep. 19, 2019

(30) Foreign Application Priority Data

Mar. 19, 2018 (JP) .............................. JP2018-050358
Jul. 31, 2018 (JP) .............................. JP2018-144226
Mar. 8, 2019 (JP) .............................. JP2019-042647

(51) Int. Cl.
*H01L 21/02* (2006.01)
*H01L 29/24* (2006.01)
(Continued)

(52) U.S. Cl.
CPC ........ *H01L 29/24* (2013.01); *H01L 21/02192* (2013.01); *H01L 21/02194* (2013.01);
(Continued)

(58) Field of Classification Search
CPC ......... H01L 21/02109; H01L 21/02518; H01L 21/02623; H01L 21/208; H01L 21/64;
(Continued)

(56) References Cited

U.S. PATENT DOCUMENTS 5,244,742 A 9/1993 Ogi et al.
9,112,039 B2 8/2015 Ueda et al.
(Continued)

FOREIGN PATENT DOCUMENTS

JP 11-269656 A 10/1999
JP 2010-283190 12/2010
(Continued)

OTHER PUBLICATIONS

Extended European Search Report dated Oct. 18, 2019 in Patent Application No. 19162409.7, 15 pages.
(Continued)

*Primary Examiner* — Cheung Lee
(74) *Attorney, Agent, or Firm* — Oblon, McClelland, Maier & Neustadt, L.L.P.

(57) ABSTRACT

A coating liquid for forming an oxide, the coating liquid including: A element, which is at least one alkaline earth metal; and B element, which is at least one selected from the group consisting of gallium (Ga), scandium (Sc), yttrium (Y), and lanthanoid, wherein when a total of concentrations of the A element is denoted by $C_A$ mg/L and a total of concentrations of the B element is denoted by $C_B$ mg/L, a total of concentrations of sodium (Na) and potassium (K) in the coating liquid is $(C_A+C_B)/10^3$ mg/L or less and a total of concentrations of chromium (Cr), manganese (Mn), iron
(Continued)

(Fe), cobalt (Co), nickel (Ni), and copper (Cu) in the coating liquid is $(C_A+C_B)/10^3$ mg/L or less.

14 Claims, 4 Drawing Sheets

(51) Int. Cl.
*H01L 29/66* (2006.01)
*H01L 21/28* (2006.01)
*H01L 29/786* (2006.01)

(52) U.S. Cl.
CPC .. *H01L 21/02565* (2013.01); *H01L 21/02628* (2013.01); *H01L 21/28167* (2013.01); *H01L 29/66765* (2013.01); *H01L 29/66969* (2013.01); *H01L 29/7869* (2013.01)

(58) Field of Classification Search
CPC ............. H01L 21/445; H01L 21/02192; H01L 21/02194; H01L 21/02565; H01L 21/02628; H01L 21/28167; H01L 29/24; H01L 29/66969
See application file for complete search history.

(56) References Cited

U.S. PATENT DOCUMENTS

| | | | |
|---|---|---|---|
| 9,418,842 B2 | 8/2016 | Nakamura et al. | |
| 9,972,274 B2 | 5/2018 | Saotome et al. | |
| 10,008,181 B2 | 6/2018 | Saotome et al. | |
| 10,115,828 B2 | 10/2018 | Abe et al. | |
| 10,141,185 B2 | 11/2018 | Ueda et al. | |
| 2002/0042210 A1 | 4/2002 | Mandal et al. | |
| 2003/0008525 A1 | 1/2003 | Mandal et al. | |
| 2003/0062261 A1* | 4/2003 | Shindo ............... | C22B 34/14 204/298.13 |
| 2012/0043537 A1 | 2/2012 | Karpov et al. | |
| 2016/0013215 A1 | 1/2016 | Ueda et al. | |
| 2016/0267873 A1 | 9/2016 | Saotome et al. | |
| 2017/0018650 A1* | 1/2017 | Saotome ............ | H01L 27/1255 |
| 2017/0116916 A1 | 4/2017 | Saotome et al. | |
| 2017/0141237 A1 | 5/2017 | Arae et al. | |
| 2017/0162172 A1 | 6/2017 | Saotome et al. | |
| 2017/0162601 A1 | 6/2017 | Arae et al. | |
| 2017/0162704 A1 | 6/2017 | Abe et al. | |
| 2017/0271381 A1* | 9/2017 | Sone ................. | H01L 21/47573 |
| 2018/0226046 A1 | 8/2018 | Saotome et al. | |
| 2018/0277060 A1 | 9/2018 | Saotome et al. | |

FOREIGN PATENT DOCUMENTS

| | | |
|---|---|---|
| JP | 2014-143403 | 8/2014 |
| JP | 2015-111653 | 6/2015 |
| JP | 2017-22315 A | 1/2017 |
| KR | 10-2003-0031199 A | 4/2003 |

OTHER PUBLICATIONS

J. R. Alcock, et al. "An Investigation of Dust Particles Found in a Ceramic Processing Environment" Journal of the European Ceramic Society, vol. 6, No. 6, XP024175262, Jan. 1, 1990, pp. 339-350.
Partial European Search Report dated Jul. 16, 2019 in European Patent Application No. 19162409.7, 16 pages.
Wei, Q, et al. "Direct patterning ITO transparent conductive coatings", Solar Energy Materials and Solar CE, Elsevier Science Publishers, Amsterdam, NL, XP004230577, vol. 68, No. 3-4, Jun. 1, 2001, pp. 383-390.
Choi, B. D, et al. Degradation of ultrathin oxides by iron contamination, Applied Physics Letters, A I P Publishing LLC, US, vol. 79, No. 16, XP012029176, Oct. 15, 2001, pp. 2645-2647.
K. Nomura, five others, "Room-temperature fabrication of transparent flexible thin-film transistors using amorphous oxide semiconductors", Nature, vol. 432, Nov. 25, 2004, pp. 488-492.
Korean Office Action dated May 13, 2020 in Korean Patent Application No. 10-2019-0028755 (with English translation), 14 pages.

* cited by examiner

US 11,069,780 B2

COATING LIQUID FOR FORMING OXIDE, METHOD FOR PRODUCING OXIDE FILM, AND METHOD FOR PRODUCING FIELD-EFFECT TRANSISTOR

CROSS-REFERENCE TO RELATED APPLICATIONS

The present application claims priority under 35 U.S.C. § 119 to Japanese Patent Application No. 2018-050358, filed Mar. 19, 2018, Japanese Patent Application No. 2018-144226, filed Jul. 31, 2018, and Japanese Patent Application No. 2019-042647, filed Mar. 8, 2019. The contents of which are incorporated herein by reference in their entirety.

BACKGROUND OF THE INVENTION

Field of the Invention

The present disclosure relates to a coating liquid for forming an oxide (hereinafter may be referred to as an "oxide-forming-coating liquid"), a method for producing an oxide film, and a method for producing a field-effect transistor.

Description of the Related Art

Field-effect transistors (FETs) are transistors which control electric current between a source electrode and a drain electrode based on the principle that an electric field is applied to a gate electrode to provide a gate in a flow of electrons or holes utilizing an electric field of a channel.

By virtue of their characteristics, the FETs have been used as, for example, switching elements and amplifying elements. The FETs are low in gate current and have a flat structure, and thus can be easily produced and integrated as compared with bipolar transistors. For these reasons, the FETs are essential elements in integrated circuits used in the existing electronic devices. The FETs have been applied to, for example, active matrix displays as thin film transistors (TFTs).

In recent years, flat panel displays (FPDs), liquid crystal displays, organic electroluminescent (EL) displays, and electronic paper have been put into practice.

These FPDs are driven by a driving circuit containing TFTs using amorphous silicon or polycrystalline silicon in an active layer. The FPDs have been required to have an increased size, improved definition and image quality, and an increased driving speed. To this end, there is a need for TFTs that have high carrier mobility, a high on/off ratio, small changes in properties over time, and small variation between the elements.

However, amorphous silicon or polycrystalline silicon have advantages and disadvantages. It was therefore difficult to satisfy all of the above requirements at the same time. In order to respond to these requirements, developments have been actively conducted on TFTs using, in an active layer, an oxide semiconductor the mobility of which can be expected to be higher than amorphous silicon. For example, disclosed is a TFT using $InGaZnO_4$ in a semiconductor layer (see K. Nomura, and 5 others "Room-temperature fabrication of transparent flexible thin film transistors using amorphous oxide semiconductors", NATURE, VOL. 432, 25, Nov., 2004, pp. 488 to 492).

In general, a semiconductor layer and a gate insulating layer constituting the TFT are formed by vapor phase methods such as a sputtering method or a CVD (Chemical Vapor Deposition) method. However, the sputtering method and the CVD method require a vacuum facility, and necessary devices are expensive, raising a problem in terms of cost. In recent years, therefore, liquid phase methods such as slit coating have attracted attention because they do not require such a vacuum device.

Among the liquid phase methods, coating methods such as slit coating and die coating, and spin coating use a coating liquid. Japanese Unexamined Patent Application Publication No. 2014-143403 discloses a precursor coating solution of a multi-component oxide semiconductor. Japanese Unexamined Patent Application Publication No. 2014-143403 discloses a precursor coating liquid that can be patterned by a printing method requiring a coating liquid having a high to medium viscosity and can obtain an oxide semiconductor film having semiconductor electrical characteristics by firing. Japanese Unexamined Patent Application Publication No. 2010-283190 discloses a semiconductor layer including a film formed using a solution or a dispersion liquid containing an oxide semiconductor precursor. In Japanese Unexamined Patent Application Publication No. 2010-283190, a gate electrode or a source electrode and a drain electrode, and a gate insulating layer are also formed by coating.

SUMMARY OF THE INVENTION

According to one aspect of the present disclosure, an oxide-forming-coating liquid includes: A element, which is at least one alkaline earth metal; and B element, which is at least one selected from the group consisting of gallium (Ga), scandium (Sc), yttrium (Y), and lanthanoid. When a total of concentrations of the A element is denoted by $C_A$ mg/L and a total of concentrations of the B element is denoted by $C_B$ mg/L, a total of concentrations of sodium (Na) and potassium (K) in the oxide-forming-coating liquid is $(C_A+C_B)/10^3$ mg/L or less and a total of concentrations of chromium (Cr), manganese (Mn), iron (Fe), cobalt (Co), nickel (Ni), and copper (Cu) in the oxide-forming-coating liquid is $(C_A+C_B)/10^3$ mg/L or less.

DESCRIPTION OF THE EMBODIMENTS

Figure 1A:
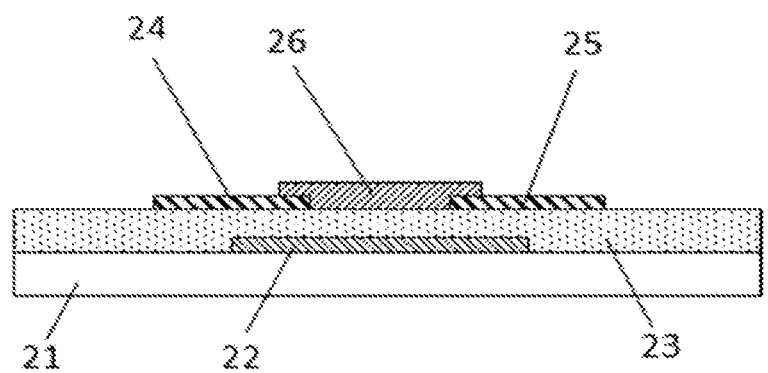
FIG. 1A is a view illustrating one example (bottom contact/bottom gate) of a field-effect transistor of the present disclosure.

The present disclosure has an object to provide an oxide-forming-coating liquid that forms an oxide film having suppressed degradation in properties thereof.

The present disclosure can provide an oxide-forming-coating liquid that forms an oxide film having no degradation in properties thereof.

The present inventors conducted extensive studies on applying an oxide-forming-coating liquid in the formation of an oxide film used for, for example, a field-effect transistor.

In the course of the studies, the present inventors found problems with generation of foreign matter in a coating step of an oxide-forming-coating liquid, occurrence of pattern defects in a patterning step of an oxide film formed by coating the oxide-forming-coating liquid, and occurrence of degradation in properties of the oxide film formed by coating the oxide-forming-coating liquid.

The present inventors continued to conduct extensive studies in order to solve the above problems and found that the above problems arose when elements such as Na, K, Cr, Mn, Fe, Co, Ni, and Cu were contained in the oxide-forming-coating liquid at certain concentrations or higher.

The present inventors further continued to conduct extensive studies and have found that the above problems can be solved by controlling elements such as Na, K, Cr, Mn, Fe, Co, Ni, and Cu in the oxide-forming-coating liquid to certain concentrations or lower in an oxide Mm formed. On the basis of this finding, the present inventors have completed the present disclosure.

Note that, as a result of prior art search by the present inventors, the present inventors have not found any prior art that studies, for example, purity of raw materials for an oxide-forming-coating liquid and preparation conditions for a coating liquid, in order to control elements such as Na, K, Cr, Mn, Fe, Co, Ni, and Cu in the oxide-forming-coating liquid to certain concentrations or lower in an oxide film formed.

(Oxide-Forming-Coating Liquid)

In one aspect, the oxide-forming-coating liquid of the present disclosure includes A element and B element, preferably includes C element, and if necessary includes other components.

The A element is at least one alkaline earth metal. Examples of the alkaline earth metal include Be (beryllium), Mg (magnesium), Ca (calcium), Sr (strontium), and Ba (barium).

The B element is at least one selected from the group consisting of Ga (gallium), Sc (scandium), Y (yttrium), and lanthanoid. Examples of the lanthanoid include La (lanthanum), Ce (cerium), Pr (praseodymium), Nd (neodymium), Pm (promethium), Sm (samarium), Eu (europium), Gd (gadolinium), Tb (terbium), Dy (dysprosium), Ho (holmium), Er (erbium), Tm (thulium), Yb (ytterbium), and Lu (lutetium).

The C element is at least one selected from the group consisting of Al (aluminium), Ti (titanium), Zr (zirconium), Hf (hafnium), Nb (niobium), and Ta (tantalum).

In one aspect, the oxide-forming-coating liquid of the present disclosure includes a metal source, which is at least one selected from the group consisting of inorganic salts, oxides, hydroxides, metal complexes, and organic salts; and a solvent; and if necessary further includes other components.

In one aspect of the oxide-forming-coating liquid, when a total of concentrations of the A element is denoted by $C_A$ mg/L and a total of concentrations of the B element is denoted by $C_B$ mg/L, a total of concentrations of sodium (Na) and potassium (K) in the oxide-forming-coating liquid is $(C_A+C_B)/10^3$ mg/L or less and a total of concentrations of chromium (Cr), manganese (Mn), iron (Fe), cobalt (Co), nickel (Ni), and copper (Cu) in the oxide-forming-coating liquid is $(C_A+C_B)/10^3$ mg/L or less.

More preferably, in one aspect of the oxide-forming-coating liquid, when a total of concentrations of the A element is denoted by $C_A$ mg/L and a total of concentrations of the B element is denoted by $C_B$ mg/L, a total of concentrations of sodium (Na) and potassium (K) in the oxide-forming-coating liquid is $(C_A+C_B)/10^6$ mg/L or less and a total of concentrations of chromium (Cr), manganese (Mn), iron (Fe), cobalt (Co), nickel (Ni), and copper (Cu) in the oxide-forming-coating liquid is $(C_A+C_B)/10^6$ mg/L or less.

Note that, "$(C_A+C_B)/10^3$" is the same as "$(C_A+C_B)\times10^{-3}$" and "$(C_A+C_B)/10^6$" is the same as "$(C_A+C_B)\times10^{-6}$".

The upper limit of the total of concentrations of Na and K in the oxide-forming-coating liquid is not particularly limited and may be appropriately selected depending on the intended purpose. The total of concentrations of Na and K may be $(C_A+C_B)/10^5$ mg/L or less or may be $(C_A+C_B)/10^4$ mg/L or less.

The upper limit of the total of concentrations of Cr, Mn, Fe, Co, and Ni in the oxide-forming-coating liquid is not particularly limited and may be appropriately selected depending on the intended purpose. The total of concentrations of Cr, Mn, Fe, Co, and Ni may be $(C_A+C_B)/10^5$ mg/L or less or $(C_A+C_B)/10^4$ mg/L or less.

The lower limit of the total of concentrations of Na and K in the oxide-forming-coating liquid is not particularly limited and may be appropriately selected depending on the intended purpose. For example, the total of concentrations of Na and K may be the detection limit or less.

The lower limit of the total of concentrations of Cr, Mn, Fe, Co, and Ni in the oxide-forming-coating liquid is not particularly limited and may be appropriately selected depending on the intended purpose. For example, the total of concentrations of Cr, Mn, Fe, Co, and Ni may be the detection limit or less.

The concentration $C_A$ of the A element and the concentration $C_B$ of the B element in the oxide-forming-coating liquid can be measured by, for example, Inductively Coupled Plasma-Optical Emission Spectroscopy (ICP-OES), Inductively Coupled Plasma-Mass Spectrometry (ICP-MS), Atomic Absorption Spectroscopy (AAS), or X-ray Fluorescence Analysis (XRF).

The concentrations of Na, K, Cr, Mn, Fe, Co, Ni, and Cu in the oxide-forming-coating liquid can be measured by, for example, Inductively Coupled Plasma-Optical Emission Spectroscopy (ICP-OES), Inductively Coupled Plasma-Mass Spectrometry (ICP-MS), Atomic Absorption Spectroscopy (AAS), or X-ray Fluorescence Analysis (XRF).

An atomic ratio (NA:NB) between a total number of atoms of the A element (NA) and a total number of atoms of the B element (NB) in the oxide-forming-coating liquid is not particularly limited and may be appropriately selected depending on the intended purpose, but is preferably in the following range.

NA:NB=(from 3 through 50) at %:(from 50 through 97) at %

Here, NA+NB=100 at %

An atomic ratio (NA:NB:NC) among the total number of atoms of the A element (NA), the total number of atoms of the B element (NB), and a total number of atoms of the C element (NC) in the oxide-forming-coating liquid is not particularly limited and may be appropriately selected depending on the intended purpose, but is preferably in the following range.

NA:NB:NC=(from 3 through 47) at %:(from 50 through 94) at %(from 3 through 47) at %

Here, NA+NB+NC=100 at %

In one aspect of the oxide-forming-coating liquid, a total (X) of concentrations of sodium (Na) and potassium (K) in an oxide film formed using the oxide-forming-coating liquid is 1,000 mg/kg or less. Further, a total (Y) of concentrations of chromium (Cr), manganese (Mn), iron (Fe), cobalt (Co), nickel (Ni), and copper (Cu) in the oxide film formed using the oxide-forming-coating liquid is 1,000 mg/kg or less.

In one aspect of the oxide-forming-coating liquid, more preferably, the total (X) of concentrations of sodium (Na) and potassium (K) in an oxide film formed using the oxide-forming-coating liquid is 1,000 µg/kg or less. Further, the total (Y) of concentrations of chromium (Cr), manganese (Mn), iron (Fe), cobalt (Co), nickel (Ni), and copper (Cu) in the oxide film formed using the oxide-forming-coating liquid is 1,000 µg/kg or less.

The concentrations of Na, K, Cr, Mn, Fe, Co, Ni, and Cu in the oxide film can be measured by dissolving the oxide film in an acidic solution and subjecting the resultant solution to, for example, Inductively Coupled Plasma-Optical Emission Spectroscopy (ICP-OES), Inductively Coupled Plasma-Mass Spectrometry (ICP-MS), Atomic Absorption Spectroscopy (AAS), or X-ray Fluorescence Analysis (XRF).

The following is one example of a preparation method of the oxide film in measurements of the total (X) of the concentrations and the total (Y) of the concentrations.

Specifically, 0.6 mL of the oxide-forming-coating liquid is dropped onto a glass substrate and spin-coated under predetermined conditions (for example, rotating at 500 rpm for 5 seconds and then rotating at 3,000 rpm for 20 seconds, and stopping the rotation so as to be 0 rpm in 5 seconds). Subsequently, the resultant is dried at 120° C. for 1 hour in the atmosphere and then baked at 400° C. for 3 hours in an $O_2$ atmosphere, to thereby form an oxide film. Note that, in order to prevent inclusion of Na, K, Cr, Mn, Fe, Co, Ni, and Cu during the preparation of the oxide film, for example, it is preferable to work in a clean room of class 1,000 or less.

The concentrations of Na, K, Cr, Mn, Fe, Co, Ni, and Cu are measured in the oxide film formed using the oxide-forming-coating liquid rather than in the oxide-forming-coating liquid, because the concentrations thereof in the formed oxide film determine properties of the oxide film. Even if the concentrations of Na, K, Cr, Mn, Fe, Co, Ni, and Cu in the coating liquid are measured, the concentrations of Na, K, Cr, Mn, Fe, Co, Ni, and Cu in the formed oxide film are varied depending on the coating amount of the coating liquid. As a result, properties of the oxide film are changed. Thus, it is necessary to measure the concentrations thereof in the oxide film.

The lower limit of the total (X) of the concentrations in the oxide film is not particularly limited and may be appropriately selected depending on the intended purpose, and may be, for example, the value of detection limit. Further, the total (X) of the concentrations may be 1 µg/kg or more, 10 µg/kg or more, or 100 µg/kg or more.

The lower limit of the total (Y) of the concentrations in the oxide film is not particularly limited and may be appropriately selected depending on the intended purpose, and may be, for example, the value of detection limit. Further, the total (Y) of the concentrations may be 1 µg/kg or more, 10 µg/kg or more, or 100 µg/kg or more.

The oxide-forming-coating liquid includes, for example, an alkaline-earth-metal-containing compound (an A-element-containing compound), a B-element-containing compound, and a solvent, preferably includes a C-element-containing compound, and if necessary includes other components.

The oxide-forming-coating liquid includes, for example, at least one selected from the group consisting of inorganic salts, oxides, hydroxides, halides, metal complexes, and organic salts of the A element.

The oxide-forming-coating liquid includes, for example, at least one selected from the group consisting of inorganic salts, oxides, hydroxides, halides, metal complexes, and organic salts of the B element.

The oxide-forming-coating liquid includes, for example, at least one selected from the group consisting of inorganic salts, oxides, hydroxides, halides, metal complexes, and organic salts of the C element.

The inorganic salt includes, for example, at least one selected from the group consisting of nitrates, sulfates, carbonates, acetates, and phosphates.

The halide includes, for example, at least one selected from the group consisting of fluorides, chlorides, bromides, and iodides.

The organic salt includes, for example, at least one selected from the group consisting of carboxylates, carbolic acid, and derivatives thereof.

—Alkaline-Earth-Metal-Containing Compound (A-Element-Containing Compound)—

The alkaline-earth-metal-containing compound (A-element-containing compound) is a compound containing an alkaline earth metal.

Examples of the alkaline-earth-metal-containing compound (A-element-containing compound) include magnesium nitrate, calcium nitrate, strontium nitrate, barium nitrate, magnesium sulfate, calcium sulfate, strontium sulfate, barium sulfate, magnesium chloride, calcium chloride, strontium chloride, barium chloride, magnesium fluoride, calcium fluoride, strontium fluoride, barium fluoride, magnesium bromide, calcium bromide, strontium bromide, barium bromide, magnesium iodide, calcium iodide, strontium iodide, barium iodide, magnesium oxide, calcium oxide, strontium oxide, barium oxide, magnesium hydroxide, calcium hydroxide, strontium hydroxide, barium hydroxide, magnesium hydroxide, magnesium methoxide, magnesium ethoxide, diethyl magnesium, magnesium acetate, magnesium formate, acetylacetone magnesium, magnesium 2-ethylhexanoate, magnesium lactate, magnesium naphthenate, magnesium citrate, magnesium salicylate, magnesium benzoate, magnesium oxalate, magnesium trifluromethanesulfonate, calcium methoxide, calcium ethoxide, calcium acetate, calcium formate, acetylacetone calcium, calcium dipivaloyl methanate, calcium 2-ethylhexanoate, calcium lactate, calcium naphthenate, calcium citrate, calcium salicylate, calcium neodecanoate, calcium benzoate, calcium oxalate, strontium isopropoxide, strontium acetate, strontium formate, acetylacetone strontium, strontium 2-ethylhexanoate, strontium lactate, strontium naphthenate, strontium salicylate, strontium oxalate, barium ethoxide, barium isopropoxide, barium acetate, barium formate, acetylacetone barium, barium 2-ethylhexanoate, barium lactate, barium naphthenate, barium neodecanoate, barium oxalate, barium benzoate, and barium trifluoromethane-sulfonate.

—B-Element-Containing Compound—

The B-element-containing compound is a compound containing the B element.

Examples of the B-element-containing compound include gallium nitrate, scandium nitrate, yttrium nitrate, lanthanum nitrate, cerium nitrate, praseodymium nitrate, neodymium nitrate, samarium nitrate, europium nitrate, gadolinium nitrate, terbium nitrate, dysprosium nitrate, holmium nitrate, erbium nitrate, thulium nitrate, ytterbium nitrate, lutetium nitrate, gallium sulfate, scandium sulfate, yttrium sulfate, lanthanum sulfate, cerium sulfate, praseodymium sulfate, neodymium sulfate, samarium sulfate, europium sulfate, gadolinium sulfate, terbium sulfate, dysprosium sulfate, holmium sulfate, erbium sulfate, thulium sulfate, ytterbium sulfate, lutetium sulfate, gallium chloride, scandium chloride, yttrium chloride, lanthanum chloride, cerium chloride, praseodymium chloride, neodymium chloride, samarium chloride, europium chloride, gadolinium chloride, terbium chloride, dysprosium chloride, holmium chloride, erbium chloride, thulium chloride, ytterbium chloride, lutetium chloride, gallium fluoride, scandium fluoride, yttrium fluoride, lanthanum fluoride, cerium fluoride, praseodymium fluoride, neodymium fluoride, samarium fluoride, europium fluoride, gadolinium fluoride, terbium fluoride, dysprosium fluoride, holmium fluoride, erbium fluoride, thulium fluoride, ytterbium fluoride, lutetium fluoride, gallium bromide, scandium bromide, yttrium bromide, lanthanum bromide, praseodymium bromide, neodymium bromide, samarium bromide, europium bromide, gadolinium bromide, terbium bromide, dysprosium bromide, holmium bromide, erbium bromide, thulium bromide, ytterbium bromide, lutetium bromide, gallium iodide, scandium iodide, yttrium iodide, lanthanum iodide, cerium iodide, praseodymium iodide, neodymium iodide, samarium iodide, europium iodide, gadolinium iodide, terbium iodide, dysprosium iodide, holmium iodide, erbium iodide, thulium iodide, ytterbium iodide, lutetium iodide, tris(cyclopentadienyl)gallium, scandium isopropoxide, scandium acetate, tris(cyclopentadienyl) scandium, yttrium isopropoxide, yttrium 2-ethylhexanoate, tris(acetylacetonato)yttrium, tris(cyclopentadienyl)yttrium, lanthanum isopropoxide, lanthanum 2-ethylhexanoate, tris(acetylacetonato)lanthanum, tris(cyclopentadienyl)lanthanum, cerium 2-ethylhexanoate, tris(acetylacetonato)cerium, tris(cyclopentadienyl)cerium, praseodymium isopropoxide, praseodymium oxalate, tris(acetylacetonato)praseodymium, tris(cyclopentadienyl)praseodymium, neodymium isopropoxide, neodymium 2-ethylhexanoate, neodymium trifluoroacetylacetonate, tris(isopropylcyclopentadienyl)neodymium, tris(ethylcyclopentadienyl)promethium, samarium isopropoxide, samarium 2-ethylhexanoate, tris(acetylacetonato)samarium, tris(cyclopentadienyl)samarium, europium 2-ethylhexanoate, tris(acetylacetonato)europium, tris(ethylcyclopentadienyl)europium, gadolinium isopropoxide, gadolinium 2-ethylhexanoate, tris(acetylacetonato)gadolinium, tris(cyclopentadienyl)gadolinium, terbium acetate, tris(acetylacetonato)terbium, tris(cyclopentadienypterbium, dysprosium isopropoxide, dysprosium acetate, tris(acetylacetonato)dysprosium, tris(ethylcyclopentadienyl)dysprosium, holmium isopropoxide, holmium acetate, tris(cyclopentadienyl)holmium, erbium isopropoxide, erbium acetate, tris(acetylacetonato)erbium, tris(cyclopentadienyl)erbium, thulium acetate, tris(acetylacetonato)thulium, tris(cyclopentadienyl)thulium, ytterbium isopropoxide, ytterbium acetate, tris(acetylacetonato)ytterbium, tris(cyclopentadienypytterbium, lutetium oxalate, and tris(ethylcyclopentadienyl)lutetium.

—C-Element-Containing Compound—

The C-element-containing compound is a compound containing the C element.

Examples of the C-element-containing compound include aluminium nitrate, hafnium sulfate, aluminium sulfate, ammonium aluminum sulfate, titanium sulfide, zirconium sulfate, aluminium hydroxide, aluminium phosphate, zirconium carbonate, aluminium fluoride, titanium fluoride, zirconium fluoride, hafnium fluoride, niobium fluoride, tantalum fluoride, aluminium chloride, titanium chloride, zirconium chloride, hafnium chloride, niobium chloride, tantalum chloride, aluminium bromide, titanium bromide, zirconium bromide, hafnium bromide, niobium bromide, tantalum bromide, aluminium iodide, titanium iodide, zirconium iodide, hafnium iodide, aluminium isopropoxide, aluminium-sec-butoxide, triethylaluminium, diethylaluminium ethoxide, aluminium acetate, acetylacetone aluminium, aluminium hexafluoroacetylacetonate, aluminium 2-ethylhexanoate, aluminium lactate, aluminium benzoate, aluminium di(s-butoxide)acetoacetic acid ester chelate, aluminium trifluoromethanesulfonate, titanium isopropoxide, bis(cyclopentadienyl)titanium chloride, zirconium butoxide, zirconium isopropoxide, zirconium bis(2-ethylhexanoate) oxide, zirconium di(n-butoxide)bisacetylacetonate, zirconium tetrakis(acetylacetonate), tetrakis(cyclopentaclienyl) zirconium, hafnium butoxide, hafnium isopropoxide, hafnium tetrakis(2-ethylhexanoate), hafnium di(n-butoxide) bisacetylacetonate, hafnium tetrakis(acetylacetonate), bis (cyclopentadienyl)dimethylhafnium, niobium ethoxide, niobium 2-ethylhexanoate, bis(cyclopentaclienyl)niobium chloride, tantalum ethoxide, and tantalum tetraethoxyacetylacetonate.

—Solvent—

Examples of the solvent include organic acids, organic acid esters, aromatic compounds, diols, glycol ethers, polar aprotic solvents, alkane compounds, alkene compounds, ethers, alcohols, and water. These may be used alone or in combination.

The amount of the solvent in the oxide-forming-coating liquid is not particularly limited and may be appropriately selected depending on the intended purpose.

The solvent is not particularly limited and may be appropriately selected depending on the intended purpose so long as it is a solvent that stably dissolves or disperses the above various compounds. Examples of the solvent include toluene, xylene, mesitylene, cymene, pentylbenzene, dodecylbenzene, bicyclohexyl, cyclohexylbenzene, decane, undecane, dodecane, tridecane, tetradecane, pentadecane, tetralin, decalin, isopropanol, ethyl benzoate, N,N-dimethylformamide, propylene carbonate, 2-ethylhexanoic acid, mineral spirits, dimethylpropylene urea, 4-butyrolactone, methanol, ethanol, 1-butanol, 1-propanol, 1-pentanol, 2-methoxyethanol, and water.

(Method for Producing Oxide-Forming-Coating Liquid)

One aspect of a method relating to the present disclosure for producing the oxide-forming-coating liquid is not particularly limited and may be appropriately selected depending on the intended purpose. The method includes, for example, measuring the oxide-forming-coating liquid containing the A element, the B element, and the solvent for the concentrations of Na, K, Cr, Mn, Fe, Co, Ni, and Cu in the oxide-forming-coating liquid.

Also, one aspect of a method relating to the present disclosure for producing the oxide-forming-coating liquid is not particularly limited and may be appropriately selected depending on the intended purpose. The method includes, for example, measuring the oxide-forming-coating liquid containing the metal source and the solvent for the total (X) of the concentrations and the total (Y) of the concentrations in the oxide film formed using the oxide-forming-coating liquid.

The concentrations of Na, K, Cr, Mn, Fe, Co, Ni, and Cu in the oxide-forming-coating liquid can be measured by, for example, Inductively Coupled Plasma-Optical Emission Spectroscopy (ICP-OES), Inductively Coupled Plasma-Mass Spectrometry (ICP-MS), Atomic Absorption Spectroscopy (AAS), or X-ray Fluorescence Analysis (XRF).

The following is one example of a preparation method of the oxide film in measurements of the total (X) of the concentrations and the total (Y) of the concentrations.

Specifically, 0.6 mL of the oxide-forming-coating liquid is dropped onto a glass substrate and spin-coated under predetermined conditions (for example, rotating at 500 rpm for 5 seconds and then rotating at 3,000 rpm for 20 seconds, and stopping the rotation so as to be 0 rpm in 5 seconds). Subsequently, the resultant is dried at 120° C. for 1 hour in the atmosphere and then baked at 400° C. for 3 hours in an $O_2$ atmosphere, to thereby form an oxide film. Note that, in order to prevent inclusion of Na, K, Cr, Mn, Fe, Co, Ni, and Cu during the preparation of the oxide film, it is preferable to work in a clean room of class 1,000 or less.

The concentrations of Na, K, Cr, Mn, Fe, Co, Ni, and Cu in the oxide film can be measured by dissolving the oxide film in an acidic solution and subjecting the resultant solution to, for example, Inductively Coupled Plasma-Optical Emission Spectroscopy (ICP-OES), Inductively Coupled Plasma-Mass Spectrometry (ICP-MS), Atomic Absorption Spectroscopy (AAS), or X-ray Fluorescence Analysis (XRF).

(Method for Evaluating Oxide-Forming-Coating Liquid)

A method relating to the present disclosure for evaluating the oxide-forming-coating liquid (a first aspect) is not particularly limited and may be appropriately selected depending on the intended purpose. The method includes, for example, measuring the oxide-forming-coating liquid containing the A element, the B element, and the solvent for the concentrations of Na, K, Cr, Mn, Fe, Co, Ni, and Cu in the oxide-forming-coating liquid.

Also, a method relating to the present disclosure for evaluating the oxide-forming-coating liquid (a second aspect) is not particularly limited and may be appropriately selected depending on the intended purpose. The method includes, for example, measuring the oxide-forming-coating liquid containing the metal source and the solvent for the total (X) of the concentrations and the total (Y) of the concentrations in the oxide film formed using the oxide-forming-coating liquid.

The concentrations of Na, K, Cr, Mn, Fe, Co, Ni, and Cu in the oxide-forming-coating liquid can be measured by, for example, Inductively Coupled Plasma-Optical Emission Spectroscopy (ICP-OES), Inductively Coupled Plasma-Mass Spectrometry (ICP-MS), Atomic Absorption Spectroscopy (AAS), or X-ray Fluorescence Analysis (XRF).

In the above evaluation method (the first aspect), for example, when a total of the A element in the oxide-forming-coating liquid is denoted by $C_A$ mg/L and a total of the B element in the oxide-forming-coating liquid is denoted by $C_B$ mg/L and when a total of concentrations of Na and K in the oxide-forming-coating liquid is $(C_A+C_B)/10^3$ mg/L or less and a total of concentrations of Cr, Mn, Fe, Co, Ni, and Cu in the oxide-forming-coating liquid is $(C_A+C_B)/10^3$ mg/L or less, it is evaluated that the oxide-forming-coating liquid of the present disclosure has been obtained.

The following is one example of a preparation method of the oxide film in measurements of the total (X) of the concentrations and the total (Y) of the concentrations.

Specifically, 0.6 mL of the oxide-forming-coating liquid is dropped onto a glass substrate and spin-coated under predetermined conditions (for example, rotating at 500 rpm for 5 seconds and then rotating at 3,000 rpm for 20 seconds, and stopping the rotation so as to be 0 rpm in 5 seconds). Subsequently, the resultant is dried at 120° C. for 1 hour in the atmosphere and then baked at 400° C. for 3 hours in an $O_2$ atmosphere, to thereby form an oxide film. Note that, in order to prevent inclusion of Na, K, Cr, Mn, Fe, Co, Ni, and Cu during the preparation of the oxide film, for example, it is preferable to work in a clean room of class 1,000 or less.

The concentrations of Na, K, Cr, Mn, Fe, Co, Ni, and Cu in the oxide film can be measured by dissolving the oxide film in an acidic solution and subjecting the resultant solution to, for example, Inductively Coupled Plasma-Optical Emission Spectroscopy (ICP-OES), Atomic Absorption Spectroscopy (AAS), or X-ray Fluorescence Analysis (XRF).

In the above evaluation method (the second aspect), for example, when the total of the concentrations of sodium (Na) and potassium (K) in the oxide film is 1,000 mg/kg or less and the total of the concentrations of chromium (Cr), manganese MIX iron (Fe), cobalt (Co), nickel (Ni), and copper (Cu) in the oxide film is 1,000 mg/kg or less, it is evaluated that the oxide-forming-coating liquid of the present disclosure has been obtained.

(Method for Producing Oxide Film)

One example of a method for producing an oxide film using the oxide-forming-coating liquid will be described.

In the method for producing an oxide film, the oxide-forming-coating liquid is coated and heat treated to obtain an oxide film.

The method for producing an oxide film includes, for example, a coating step and a heat treatment step; and if necessary further includes other steps.

The coating step is not particularly limited and may be appropriately selected depending on the intended purpose so long as the coating step is a step of coating the oxide-forming-coating liquid onto an object to be coated. A method of the coating is not particularly limited and may be appropriately selected depending on the intended purpose. Examples of the method include: a method of forming a film through a solution process and patterning the film through photolithography; and a method of directly forming a film having a desired shape by printing, such as inkjet printing, nanoimprinting, or gravure printing. Examples of the solution process include dip coating, spin coating, die coating, and nozzle printing.

The heat treatment step is not particularly limited and may be appropriately selected depending on the intended purpose so long as the heat treatment step is a step of heat-treating the oxide-forming-coating liquid coated on the object to be coated. Note that, in the heat treatment step, the oxide-forming-coating liquid coated on the object to be coated may be dried through, for example, air drying. By the heat treatment, for example, the solvent is dried and the oxide is baked.

In the heat treatment step, drying of the solvent (hereinafter referred to as "drying treatment") and baking of the oxide (hereinafter referred to as "baking treatment") are preferably performed at different temperatures. Specifically, it is preferable that after the drying of the solvent, the temperature be elevated to bake the oxide. At the time of baking of the oxide, for example, decomposition of at least one selected from the group consisting of the alkaline-earth-metal-containing compounds (the A-element-containing compounds), the B-element-containing compounds, and the C-element-containing compounds occurs.

A temperature of the drying treatment is not particularly limited and may be appropriately selected depending on the solvent contained. For example, the temperature of the drying treatment is from 80° C. through 180° C. As for the drying, it is effective to use, for example, a vacuum oven for reducing the required temperature. Time of the drying treatment is not particularly limited and may be appropriately selected depending on the intended purpose. For example, the time of the drying treatment is from 30 seconds through 1 hour.

A temperature of the baking treatment is not particularly limited and may be appropriately selected depending on the intended purpose. However, the temperature of the baking treatment is preferably 100° C. or higher but lower than 450° C., more preferably from 200° C. through 400° C. Time of the baking treatment is not particularly limited and may be appropriately selected depending on the intended purpose. For example, the time of the baking treatment is from 30 minutes through 5 hours.

Note that, in the heat treatment step, the drying treatment and the baking treatment may be continuously performed or may be performed in a divided manner of a plurality of steps.

A method of the heat treatment is not particularly limited and may be appropriately selected depending on the intended purpose. Examples of the method of the heat treatment include a method of heating the object to be coated. An atmosphere in the heat treatment is not particularly limited and may be appropriately selected depending on the intended purpose. However, the atmosphere is preferably the atmosphere or an oxygen atmosphere. When the heat treatment is performed in the atmosphere or the oxygen atmosphere, decomposed products can be promptly discharged to the outside of the system and generation of the oxide can be accelerated.

In the heat treatment, in view of acceleration of reaction of the generation treatment, it is effective to apply ultraviolet rays having a wavelength of 400 nm or shorter to the material after the drying treatment. Applying the ultraviolet rays having a wavelength of 400 nm or shorter can cleave chemical bonds in, for example, the inorganic material and the organic material contained in the material after the drying treatment and can decompose the inorganic material and the organic material. Therefore, the oxide can be efficiently formed. The ultraviolet rays having a wavelength of 400 nm or shorter are not particularly limited and may be appropriately selected depending on the intended purpose. Examples of the ultraviolet rays include ultraviolet rays having a wavelength of 222 nm emitted from an excimer lamp. It is also preferable to apply ozone instead of or in combination with the ultraviolet rays. Applying the ozone to the material after the drying treatment accelerates generation of the oxide.

In the oxide-forming-coating liquid, a solute is uniformly dissolved in the solvent. Thus, the oxide film formed using the oxide-forming-coating liquid is uniform. For example, the formed oxide film can be an oxide film having a low leakage current when used as a gate insulating film.

In the oxide-forming-coating liquid, when the total of concentrations of the A element is denoted by $C_A$ mg/L and the total of concentrations of the B element is denoted by $C_B$ mg/L, the total of concentrations of Na and K in the oxide-forming-coating liquid is $(C_A+C_B)/10^3$ mg/L or less. Thus, when the oxide film formed using the oxide-forming-coating liquid is an insulator film, leakage current due to Na and K is low. An excellent insulating film can be provided.

Also, in the oxide-forming-coating liquid, when the total of concentrations of the A element is denoted by $C_A$ mg/L and the total of concentrations of the B element is denoted by $C_B$ mg/L, the total of concentrations of Cr, Mn, Fe, Co, Ni, and Cu in the oxide-forming-coating liquid is $(C_A+C_B)/10^3$ mg/L or less. Thus, etching residues due to Cr, Mn, Fe, Co, Ni, and Cu are not generated in etching the oxide film formed using the oxide-forming-coating liquid. Excellent patterning of the oxide film is possible.

In the oxide film formed using the oxide-forming-coating liquid, the total of the concentrations of Na and K is 1,000 mg/kg or less. Thus, when the oxide film is an insulator film, leakage current due to Na and K is low. An excellent insulating film can be provided.

In the oxide film formed using the oxide-forming-coating liquid, the total of the concentrations of Cr, Mn, Fe, Co, Ni, and Cu is 1,000 mg/kg or less. Thus, etching residues due to Cr, Mn, Fe, Co, Ni, and Cu are not generated in etching the oxide film formed using the oxide-forming-coating liquid. Excellent patterning of the oxide film is possible.

(Method for Producing Field-Effect Transistor)

The following is one example of a case of producing a field-effect transistor using the oxide film (gate insulating layer) produced using the oxide-forming-coating liquid.

The field-effect transistor includes at least a gate insulating layer; and if necessary further includes other components such as a gate electrode, a source electrode, a drain electrode, and a semiconductor layer.

—Gate Electrode—

The gate electrode is, for example, in contact with the gate insulating layer and faces the semiconductor layer via the gate insulating layer.

The gate electrode is not particularly limited and may be appropriately selected depending on the intended purpose so long as the gate electrode is an electrode configured to apply a gate voltage to the field-effect transistor.

A material of the gate electrode is not particularly limited and may be appropriately selected depending on the intended purpose. Examples of the material include: metals (e.g., Mo, Ti, Al, Au, Ag, and Cu) and alloys of these metals; transparent conductive oxides, such as indium tin oxide (ITO) and antimony-doped tin oxide (ATO); and organic conductors, such as polyethylene dioxythiophene (PEDOT) and polyaniline (PANI).

—Formation Method of Gate Electrode—

A formation method of the gate electrode is not particularly limited and may be appropriately selected depending on the intended purpose. Examples of the formation method include: (i) a method of forming a film through sputtering or dip coating and patterning the film through photolithography; and (ii) a method of directly forming a film having a desired shape through a printing process, such as inkjet printing, nanoimprinting, or gravure printing.

An average film thickness of the gate electrode is not particularly limited and may be appropriately selected depending on the intended purpose. However, the average film thickness of the gate electrode is preferably from 20 nm through 1 μm, more preferably from 50 nm through 300 nm.

—Source Electrode and Drain Electrode—

The source electrode and the drain electrode are, for example, electrodes configured to take electric current out from the field-effect transistor.

A material of the source electrode and the drain electrode is not particularly limited and may be appropriately selected depending on the intended purpose. Examples of the material include: metals (e.g., Mo, Al, Au, Ag, and Cu) and alloys of these metals; transparent conductive oxides, such as indium tin oxide (ITO) and antimony-doped tin oxide (ATO); and organic conductors, such as polyethylene dioxythiophene (PEDOT) and polyaniline (PANI).

—Formation Method of Source Electrode and Drain Electrode—

A formation method of the source electrode and the drain electrode is not particularly limited and may be appropriately selected depending on the intended purpose. Examples of the formation method include: (i) a method of forming a film through sputtering or dip coating and patterning the film through photolithography; and (ii) a method of directly forming a film having a desired shape through a printing process, such as inkjet printing, nanoimprinting, or gravure printing.

An average film thickness of the source electrode and the drain electrode is not particularly limited and may be appropriately selected depending on the intended purpose. However, the average film thickness is preferably from 20 nm through 1 μm, more preferably from 50 nm through 300 nm.

—Semiconductor Layer—

The semiconductor layer is, for example, provided adjacent to the source electrode and the drain electrode.

The semiconductor layer includes a channel forming region, a source region, and a drain region. The source region is in contact with the source electrode. The drain region is in contact with the drain electrode. The specific resistance of the source region and the drain region is preferably lower than that of the channel forming region.

A material of the semiconductor layer is not particularly limited and may be appropriately selected depending on the intended purpose. Examples of the material include silicon semiconductors and oxide semiconductors.

Examples of the silicon semiconductors include amorphous silicon and polycrystalline silicon.

Examples of the oxide semiconductors include In—Ga—Zn—O, In—Zn—O, and In—Mg—O.

Among these examples, oxide semiconductors are preferable.

—Formation Method of Semiconductor Layer—

A formation method of the semiconductor layer is not particularly limited and may be appropriately selected depending on the intended purpose. Examples of the formation method include: a method of forming a film through a vacuum process (e.g., sputtering, pulsed laser deposition (PLD), chemical vapor deposition (CVD), or atomic layer deposition (ALD)) or a solution process (e.g., dip coating, spin coating, or die coating) and patterning the film through photolithography; and a method of directly forming a film having a desired shape through a printing method, such as inkjet printing, nanoimprinting, or gravure printing.

An average film thickness of the semiconductor layer is not particularly limited and may be appropriately selected depending on the intended purpose. However, the average film thickness of the semiconductor layer is preferably from 5 nm through 1 μm, more preferably from 10 nm through 0.5 μm.

—Gate Insulating Layer—

The gate insulating layer is, for example, provided between the gate electrode and the semiconductor layer.

—Formation Method of Gate Insulating Layer Using Oxide-Forming-Coating Liquid—

A formation method of the gate insulating layer is not particularly limited and may be appropriately selected depending on the intended purpose. As described in the above section "(Method for producing oxide film)", a coating method such as spin coating, die coating, or inkjet coating using the oxide-forming-coating liquid is preferable.

An average film thickness of the gate insulating layer is not particularly limited and may be appropriately selected depending on the intended purpose. However, the average film thickness of the gate insulating layer is preferably from 50 nm through 3 μm, more preferably from 100 nm through 1 μm.

A structure of the field-effect transistor is not particularly limited and may be appropriately selected depending on the intended purpose. Examples of the structure of the field-effect transistor include the following structures:

(1) a field-effect transistor containing a substrate, the gate electrode formed on the substrate, the gate insulating layer formed on the gate electrode, the source electrode and the drain electrode formed on the gate insulating layer, and a semiconductor layer formed between the source electrode and the drain electrode; and (2) a field-effect transistor containing a substrate, the source electrode and the drain electrode formed on the substrate, the semiconductor layer formed between the source electrode and the drain electrode, the gate insulating layer formed on the source electrode, the drain electrode, and the semiconductor layer, and the gate electrode formed on the gate insulating layer.

Figure 1B:
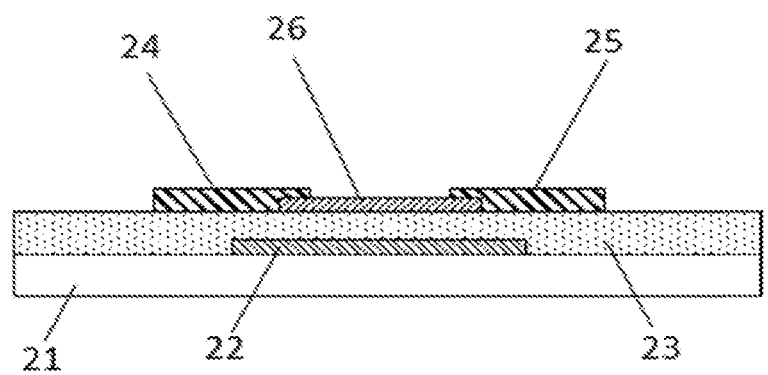
FIG. 1B is a view illustrating one example (top contact/bottom gate) of a field-effect transistor of the present disclosure.

The field-effect transistor having the structure described in the above (1) is, for example, a bottom contact/bottom gate type (FIG. 1A) and a top contact/bottom gate type (FIG. 1B).

Figure 1C:
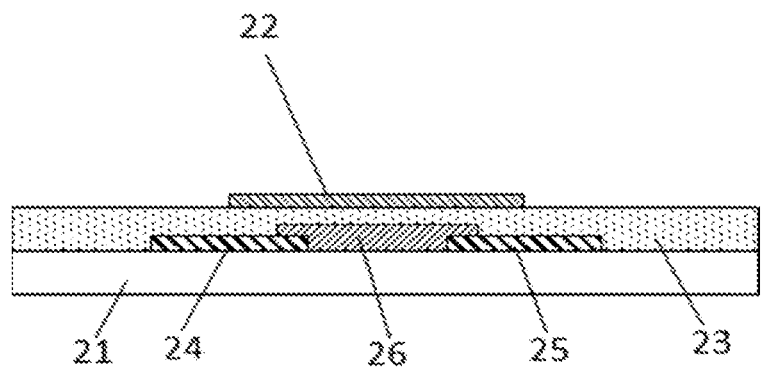
FIG. 1C is a view illustrating one example (bottom contact/top gate) of a field-effect transistor of the present disclosure.
Figure 1D:
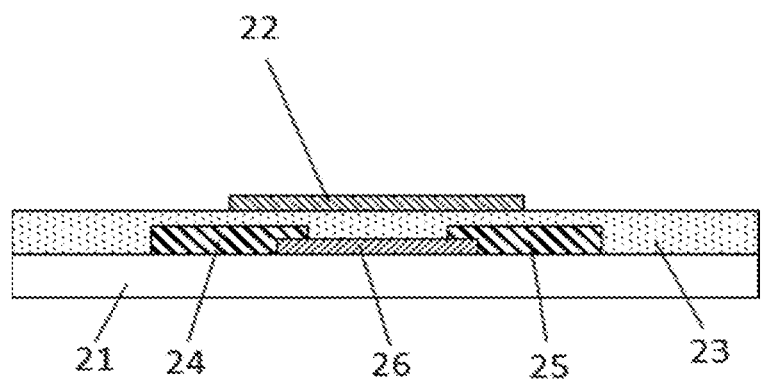
FIG. 1D is a view illustrating one example (top contact/top gate) of a field-effect transistor of the present disclosure.

The field-effect transistor having the structure described in the above (2) is, for example, a bottom contact/top gate type (FIG. 1C) and a top contact/top gate type (FIG. 1D).

In FIG. 1A to FIG. 1D, reference numeral 21 denotes a substrate, reference numeral 22 denotes a gate electrode, reference numeral 23 denotes a gate insulating layer, reference numeral 24 denotes a source electrode, reference numeral 25 denotes a drain electrode, and reference numeral 26 denotes an oxide semiconductor layer.

EXAMPLES

The present disclosure will next be described by way of Examples, but the Examples should not be construed to limit the present disclosure in any way.

Example 1

—Preparation of Oxide-Forming-Coating Liquid—2.17 mL of lanthanum 2-ethylhexanoate (product number 128-03371, available from Wako Pure Chemical Industries, Ltd.) and 0.63 mL of strontium 2-ethylhexanoate (product number 195-09561, available from Wako Pure Chemical Industries, Ltd.) were mixed in 1.2 mL of cyclohexylbenzene (product number 07560-00, available from KANTO CHEMICAL CO., INC.) to obtain an oxide-forming-coating liquid. The preparation of the oxide-forming-coating liquid in Example 1 was conducted in a clean room of class 1000. The clean room of class 1000 means an environment where particles having a size of 0.5 μm or more were about $1\times10^3$ or less in a volume of 0.028 m$^3$.

Figure 2A:
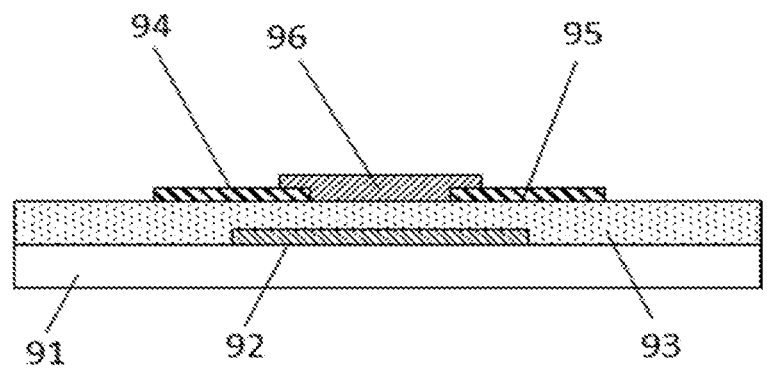
FIG. 2A is a schematic view illustrating field-effect transistors produced in Examples 1, 5, and 10 and Comparative Example 1.

Next, a bottom contact/bottom gate field-effect transistor as illustrated in FIG. 2A was produced.

<Production of Field-Effect Transistor>

—Formation of Gate Electrode—

First, a gate electrode 92 was formed on a glass substrate (base 91). Specifically, a Mo (molybdenum) film was formed on the glass substrate (base 91) by DC sputtering so as to have an average film thickness of about 100 nm. Thereafter, a photoresist was coated thereon, and the resultant was subjected to prebaking, exposure by an exposing device, and developing, to thereby form a resist pattern having the same pattern as that of the gate electrode 92 to be formed. Moreover, resist-pattern-free regions of the Mo film were removed by reactive ion etching (RIE). Thereafter, the resist pattern was also removed to form the gate electrode 92 formed of the Mo film.

—Formation of Gate Insulating Layer—

Next, 0.6 mL of the oxide-forming-coating liquid was dropped onto the substrate and spin-coated under predetermined conditions (rotating at 500 rpm for 5 seconds and then rotating at 3,000 rpm for 20 seconds, and stopping the rotation so as to be 0 rpm in 5 seconds). Subsequently, the resultant was dried at 120° C. for 1 hour in the atmosphere and then baked at 400° C. for 3 hours in an O$_2$ atmosphere, to thereby form an oxide film. Thereafter, a photoresist was coated on the oxide film, and the resultant was subjected to prebaking, exposure by an exposing device, and developing, to thereby form a resist pattern having the same pattern as that of a gate insulating layer 93 to be formed. Moreover, resist-pattern-free regions of the oxide film were removed by wet etching with hydrochloric acid. Thereafter, the resist pattern was also removed to form the gate insulating layer 93. The average film thickness of the gate insulating layer was found to be about 100 nm.

—Formation of Source Electrode and Drain Electrode—

Next, a source electrode 94 and a drain electrode 95 were formed on the gate insulating layer 93. Specifically, a Mo (molybdenum) film was formed on the gate insulating layer 93 by DC sputtering so as to have an average film thickness of about 100 nm. Thereafter, a photoresist was coated on the Mo film, and the resultant was subjected to prebaking, exposure by an exposing device, and developing, to thereby form a resist pattern having the same pattern as that of the source electrode 94 and the drain electrode 95 to be formed. Moreover, resist-pattern-free regions of the Mo film were removed by RIE. Thereafter, the resist pattern was also removed to form the source electrode 94 and the drain electrode 95, each of which was formed of the Mo film.

—Formation of Oxide Semiconductor Layer—

Next, an oxide semiconductor layer 96 was formed. Specifically, a Mg—In based oxide (In$_2$MgO$_4$) film was formed by DC sputtering so as to have an average film thickness of about 100 nm. Thereafter, a photoresist was coated on the Mg—In based oxide film, and the resultant was subjected to prebaking, exposure by an exposing device, and developing, to form a resist pattern having the same pattern as that of the oxide semiconductor layer 96 to be formed. Moreover, resist-pattern-free regions of the Mg—In based oxide film were removed by wet etching. Thereafter, the resist pattern was also removed to form the oxide semiconductor layer 96. As a result, the oxide semiconductor layer 96 was formed in a manner that a channel was formed between the source electrode 94 and the drain electrode 95.

Finally, the resultant was subjected to a heat treatment at 300° C. for 1 hour in the atmosphere as a heat treatment of a post treatment, to thereby complete a field-effect transistor.

<Production of Capacitor for Evaluation of Insulation Property>

Figure 3:
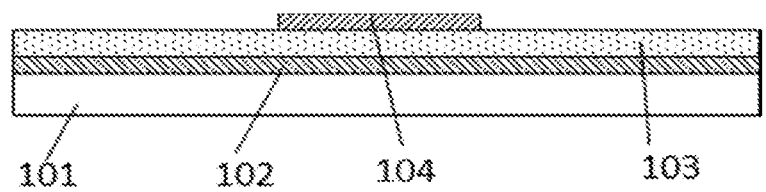
FIG. 3 is a schematic view illustrating capacitors produced in Examples 1 to 11 and Comparative Examples 1 to 3.

Next, a capacitor having the structure illustrated in FIG. 3 was produced. Specifically, an Al (aluminum) film was formed on a glass substrate (base 101) by a vacuum vapor deposition method so as to have an average film thickness of about 100 nm using a metal mask having an opening in the region where a lower electrode 102 was to be formed. By the method described in the formation of the gate insulating layer of the field effect transistor in Example 1, an insulator thin film 103 having an average film thickness of about 100 nm was formed. Finally, using a metal mask having an opening in the region where an upper electrode 104 was to be formed, an Al film was formed by a vacuum vapor deposition method so as to have an average film thickness of about 100 nm, to thereby complete a capacitor.

Example 2

—Preparation of Oxide-Forming-Coating Liquid—

1.51 g of yttrium chloride (product number 259-00272, available from Wako Pure Chemical Industries, Ltd.), 0.02 g of magnesium chloride (product number 136-03995, available from Wako Pure Chemical Industries, Ltd.), and 0.10 g of hafnium chloride (product number 083-06931, available from Wako Pure Chemical Industries, Ltd.) were mixed in 9 ml of ultra pure water (product number 95305-1L, available from Sigma-Aldrich) and 9 ml of ethanol (product number 14033-02, available from KANTO CHEMICAL CO., INC.), to thereby obtain an oxide-forming-coating liquid. The water and ethanol, each serving as a solvent, were used in a state of not being in contact with SUS 304. The preparation of the oxide-forming-coating liquid in Example 2 was conducted in a clean room of class 1000.

Figure 2B:
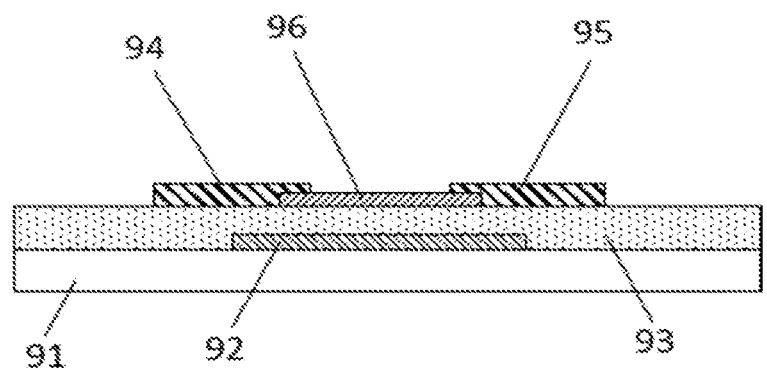
FIG. 2B is a schematic view illustrating a field-effect transistor produced in Examples 4, 9, and 11 and Comparative Example 3.
Figure 2C:
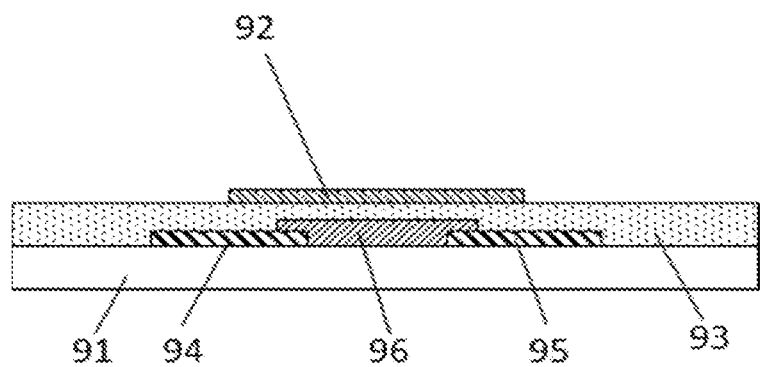
FIG. 2C is a schematic view illustrating field-effect transistors produced in Examples 3, 7, and 8 and Comparative Example 2.
Figure 2D:
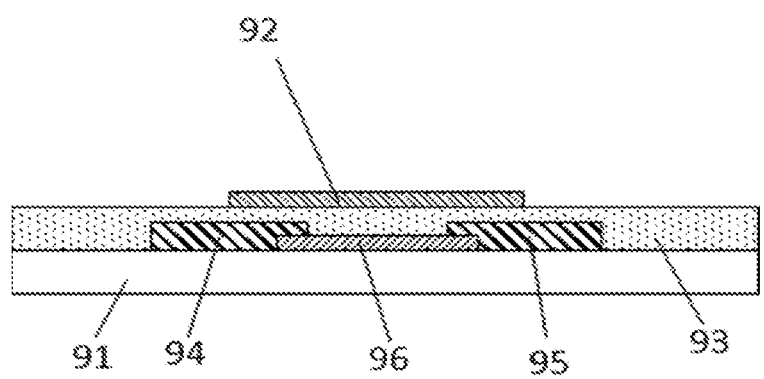
FIG. 2D is a schematic view illustrating a field-effect transistor produced in Examples 2 and 6.

Next, a top contact/top gate field-effect transistor as illustrated in FIG. 2D was produced.

<Production of Field-Effect Transistor>

—Formation of Oxide Semiconductor Layer—

First, an oxide semiconductor layer 96 was formed on a glass substrate (base 91). Specifically, a Mg—In based oxide (In$_2$MgO$_4$) film was formed by DC sputtering so as to have an average film thickness of about 100 nm. Thereafter, a photoresist was coated on the Mg—In based oxide film, and the resultant was subjected to prebaking, exposure by an exposing device, and developing, to form a resist pattern having the same pattern as that of the oxide semiconductor layer 96 to be formed. Moreover, resist-pattern-free regions of the Mg—In based oxide film were removed by etching. Thereafter, the resist pattern was also removed to form the oxide semiconductor layer 96.

—Formation of Source Electrode and Drain Electrode—

Next, a source electrode 94 and a drain electrode 95 were formed on the substrate and the oxide semiconductor layer. Specifically, a Mo (molybdenum) film was formed on the substrate and the oxide semiconductor layer by DC sputtering so as to have an average film thickness of about 100 nm. Thereafter, a photoresist was coated on the Mo film, and the resultant was subjected to prebaking, exposure by an exposing device, and developing, to thereby form a resist pattern having the same pattern as that of the source electrode 94 and the drain electrode 95 to be formed. Moreover, resistpattern-free regions of the Mo film were removed by etching. Thereafter, the resist pattern was also removed to form the source electrode 94 and the drain electrode 95, each of which was formed of the Mo film.

—Formation of Gate Insulating Layer—

Next, 0.6 mL of the oxide-forming-coating liquid was dropped onto the substrate, the oxide semiconductor layer, the source electrode, and the drain electrode and spin-coated under predetermined conditions (rotating at 500 rpm for 5 seconds and then rotating at 3,000 rpm for 20 seconds, and stopping the rotation so as to be 0 rpm in 5 seconds). Subsequently, the resultant was dried at 120° C. for 1 hour in the atmosphere and then baked at 400° C. for 3 hours in an $O_2$ atmosphere, to thereby form an oxide film. Thereafter, a photoresist was coated on the oxide film, and the resultant was subjected to prebaking, exposure by an exposing device, and developing, to thereby form a resist pattern having the same pattern as that of a gate insulating layer 93 to be formed. Moreover, resist-pattern-free regions of the oxide film were removed by wet etching with hydrochloric acid. Thereafter, the resist pattern was also removed to form the gate insulating layer 93. The average film thickness of the gate insulating layer was found to be about 118 nm.

—Formation of Gate Electrode—

Next, a gate electrode 92 was formed on the gate insulating layer. Specifically, a Mo (molybdenum) film was formed on the gate insulating layer by DC sputtering so as to have an average film thickness of about 100 nm. Thereafter, a photoresist was coated on the Mo film, and the resultant was subjected to prebaking, exposure by an exposing device, and developing, to thereby form a resist pattern having the same pattern as that of the gate electrode 92 to be formed. Moreover, resist-pattern-free regions of the Mo film were removed by etching. Thereafter, the resist pattern was also removed to form the gate electrode 92 formed of the Mo film.

Finally, the resultant was subjected to a heat treatment at 300° C. for 1 hour in the atmosphere as a heat treatment of a post treatment, to thereby complete a field-effect transistor.

<Production of Capacitor for Evaluation of Insulation Property>

Next, a capacitor having the structure illustrated in FIG. 3 was produced. Specifically, an Al (aluminum) film was formed on a glass substrate (base 101) by a vacuum vapor deposition method so as to have an average film thickness of about 100 nm using a metal mask having an opening in the region where a lower electrode 102 was to be formed. By the method described in the formation of the gate insulating layer of the field effect transistor in Example 2, an insulator thin film 103 having an average film thickness of about 118 nm was formed. Finally, using a metal mask having an opening in the region where an upper electrode 104 was to be formed, an Al film was formed by a vacuum vapor deposition method so as to have an average film thickness of about 100 nm, to thereby complete a capacitor.

Example 3

—Preparation of Oxide-Forming-Coating Liquid—

9 mL of methanol (product number 25183-08, available from KANTO CHEMICAL CO., INC.), 9 mL of ethylene glycol monoisopropyl ether (product number 20223-02, available from KANTO CHEMICAL CO., INC.), 1.15 g of lanthanum nitrate (product number 011267, available from Alfa Aesar, purity 99.99%), 0.08 g of calcium nitrate (product number 030482, available from Alfa Aesar, purity 99.98%), and 0.06 g of zirconium chloride (product number 265-00672, available from Wako Pure Chemical Industries, Ltd.) were mixed to obtain an oxide-forming-coating liquid. The preparation of the oxide-forming-coating liquid in Example 3 was conducted in a clean room of class 1000.

Next, a bottom contact/top gate field-effect transistor as illustrated in FIG. 2C was produced.

—Formation of Source Electrode and Drain Electrode—

First, a source electrode 94 and a drain electrode 95 were formed on a glass substrate (base 91). Specifically, a Mo (molybdenum) film was formed on the substrate by DC sputtering so as to have an average film thickness of about 100 nm. Thereafter, a photoresist was coated on the Mo film, and the resultant was subjected to prebaking, exposure by an exposing device, and developing, to thereby form a resist pattern having the same pattern as that of the source electrode 94 and the drain electrode 95 to be formed. Moreover, resist-pattern-free regions of the Mo film were removed by etching. Thereafter, the resist pattern was also removed to form the source electrode 94 and the drain electrode 95, each of which was formed of the Mo film.

—Formation of Oxide Semiconductor Layer—

Next, an oxide semiconductor layer 96 was formed. Specifically, an In—Ga—Zn based oxide film was formed by DC sputtering so as to have an average film thickness of about 100 nm. Thereafter, a photoresist was coated on the In—Ga—Zn based oxide film, and the resultant was subjected to prebaking, exposure by an exposing device, and developing, to form a resist pattern having the same pattern as that of the oxide semiconductor layer 96 to be formed. Moreover, resist-pattern-free regions of the In—Ga—Zn based oxide film were removed by etching. Thereafter, the resist pattern was also removed to form the oxide semiconductor layer 96. As a result, the oxide semiconductor layer 96 was formed in a manner that a channel was formed between the source electrode 94 and the drain electrode 95.

—Formation of Gate Insulating Layer—

Next, 0.25 mL of the oxide-forming-coating liquid was dropped onto the substrate, the oxide semiconductor layer, the source electrode, and the drain electrode and spin-coated under predetermined conditions (rotating at 500 rpm for 5 seconds and then rotating at 2,000 rpm for 20 seconds, and stopping the rotation so as to be 0 rpm in 5 seconds). Subsequently, the resultant was dried at 120° C. for 1 hour in the atmosphere and then baked at 400° C. for 3 hours in an $O_2$ atmosphere, to thereby form an oxide film. Thereafter, a photoresist was coated on the oxide film, and the resultant was subjected to prebaking, exposure by an exposing device, and developing, to thereby form a resist pattern having the same pattern as that of a gate insulating layer 93 to be formed. Moreover, resist-pattern-free regions of the oxide film were removed by wet etching with hydrochloric acid. Thereafter, the resist pattern was also removed to form the gate insulating layer 93. The average film thickness of the gate insulating layer was found to be about 127 nm.

—Formation of Gate Electrode—

Next, a gate electrode 92 was formed on the gate insulating layer. Specifically, a Mo (molybdenum) film was formed on the gate insulating layer by DC sputtering so as to have an average film thickness of about 100 nm. Thereafter, a photoresist was coated on the Mo film, and the resultant was subjected to prebaking, exposure by an exposing device, and developing, to thereby form a resist pattern having the same pattern as that of the gate electrode 92 to be formed. Moreover, resist-pattern-free regions of the Mo film were removed by etching. Thereafter, the resist pattern was also removed to form the gate electrode 92 formed of the Mo film.

Finally, the resultant was subjected to a heat treatment at 300° C. for 1 hour in the atmosphere as a heat treatment of a post treatment, to thereby complete a field-effect transistor.

<Production of Capacitor for Evaluation of Insulation Property>

Next, a capacitor having the structure illustrated in FIG. 3 was produced. Specifically, an Al (aluminum) film was formed on a glass substrate (base 101) by a vacuum vapor deposition method so as to have an average film thickness of about 100 nm using a metal mask having an opening in the region where a lower electrode 102 was to be formed. By the method described in the formation of the gate insulating layer of the field effect transistor in Example 3, an insulator thin film 103 having an average film thickness of about 127 nm was formed. Finally, using a metal mask having an opening in the region where an upper electrode 104 was to be formed, an Al film was formed by a vacuum vapor deposition method so as to have an average film thickness of about 100 nm, to thereby complete a capacitor.

Example 4

—Preparation of Oxide-Forming-Coating Liquid—

0.54 mL of scandium(III) tris(2,2,6,6-tetramethyl 3,5-heptanedionate) (product number 517607, available from Sigma-Aldrich) and 0.41 mL of a barium 2-ethylhexanoate toluene solution (Ba content: 8 wt %, product number 021-09471, available from Wako Pure Chemical Industries, Ltd.) were mixed in 1.2 mL of toluene (product number 40180-79, available from KANTO CHEMICAL CO., INC., PrimePure grade), to thereby obtain an oxide-forming-coating liquid. The preparation of the oxide-forming-coating liquid in Example 4 was conducted in a clean room of class 1000.

Next, a top contact/bottom gate field-effect transistor as illustrated in FIG. 2B was produced.

—Formation of Gate Electrode—

First, a gate electrode 92 was formed on a glass substrate (base 91). Specifically, a Mo (molybdenum) film was formed on the glass substrate (base 91) by DC sputtering so as to have an average film thickness of about 100 nm. Thereafter, a photoresist was coated on the Mo film, and the resultant was subjected to prebaking, exposure by an exposing device, and developing, to thereby form a resist pattern having the same pattern as that of the gate electrode 92 to be formed. Moreover, resist-pattern-free regions of the Mo film were removed by etching. Thereafter, the resist pattern was also removed to form the gate electrode 92 formed of the Mo film.

—Formation of Gate Insulating Layer—

Next, 0.25 mL of the oxide-forming-coating liquid was dropped onto the substrate and spin-coated under predetermined conditions (rotating at 500 rpm for 5 seconds and then rotating at 2,000 rpm for 20 seconds, and stopping the rotation so as to be 0 rpm in 5 seconds). Subsequently, the resultant was dried at 120° C. for 1 hour in the atmosphere and then baked at 400° C. for 3 hours in an $O_2$ atmosphere, to thereby form an oxide film. Thereafter, a photoresist was coated on the oxide film, and the resultant was subjected to prebaking, exposure by an exposing device, and developing, to thereby form a resist pattern having the same pattern as that of a gate insulating layer 93 to be formed. Moreover, resist-pattern-free regions of the oxide film were removed by wet etching with hydrochloric acid. Thereafter, the resist pattern was also removed to form the gate insulating layer 93. The average film thickness of the gate insulating layer was found to be about 116 nm.

—Formation of Oxide Semiconductor Layer—

Next, an oxide semiconductor layer 96 was formed. Specifically, an In—Ga—Zn based oxide film was formed by DC sputtering so as to have an average film thickness of about 100 nm. Thereafter, a photoresist was coated on the In—Ga—Zn based oxide film, and the resultant was subjected to prebaking, exposure by an exposing device, and developing, to form a resist pattern having the same pattern as that of the oxide semiconductor layer 96 to be formed. Moreover, resist-pattern-free regions of the In—Ga—Zn based oxide film were removed by etching. Thereafter, the resist pattern was also removed to form the oxide semiconductor layer 96.

—Formation of Source Electrode and Drain Electrode—

Next, a source electrode 94 and a drain electrode 95 were formed on the gate insulating layer 93 and the oxide semiconductor layer. Specifically, a Mo (molybdenum) film was formed on the gate insulating layer 93 by DC sputtering so as to have an average film thickness of about 100 nm. Thereafter, a photoresist was coated on the Mo film, and the resultant was subjected to prebaking, exposure by an exposing device, and developing, to form a resist pattern having the same pattern as that of the source electrode 94 and the drain electrode 95 to be formed. Moreover, resist-pattern-free regions of the Mo film were removed by etching. Thereafter, the resist pattern was also removed to form the source electrode 94 and the drain electrode 95, each of which was formed of the Mo film. As a result, the source electrode 94 and the drain electrode 95 were formed in a manner that a channel was formed on the oxide semiconductor layer 96.

Finally, the resultant was subjected to a heat treatment at 300° C. for 1 hour in the atmosphere as a heat treatment of a post treatment, to thereby complete a field-effect transistor.

<Production of Capacitor for Evaluation of Insulation Property>

Next, a capacitor having the structure illustrated in FIG. 3 was produced. Specifically, an Al (aluminum) film was formed on a glass substrate (base 101) by a vacuum vapor deposition method so as to have an average film thickness of about 100 nm using a metal mask having an opening in the region where a lower electrode 102 was to be formed. By the method described in the formation of the gate insulating layer of the field effect transistor in Example 4, an insulator thin film 103 having an average film thickness of about 62 nm was formed. Finally, using a metal mask having an opening in the region where an upper electrode 104 was to be formed, an Al film was formed by a vacuum vapor deposition method so as to have an average film thickness of about 100 nm, to thereby complete a capacitor.

Example 5

—Preparation of Oxide-Forming-Coating Liquid—

2.17 mL of lanthanum 2-ethylhexanoate (product number 128-03371, available from Wako Pure Chemical Industries, Ltd.) and 0.63 mL of strontium 2-ethylhexanoate (product number 195-09561, available from Wako Pure Chemical Industries, Ltd.) were mixed in 1.2 mL of cyclohexylbenzene (product number 07560-00, available from KANTO CHEMICAL CO., INC.) to obtain an oxide-forming-coating liquid. The preparation of the oxide-forming-coating liquid in Example 5 was conducted in a draft chamber in a general laboratory. The draft chamber of the general laboratory was an environment where particles having a size of 0.5 μm or more were about $1 \times 10^5$ in a volume of 0.028 m³.

<Production of Field-Effect Transistor>

Next, the oxide-forming-coating liquid was used in the same manner as in Example 1, to thereby produce a bottom contact/bottom gate field-effect transistor as illustrated in FIG. 2A.

<Production of Capacitor for Evaluation of Insulation Property>

Next, the oxide-forming-coating liquid was used in the same manner as in Example 1, to thereby produce a capacitor having the structure illustrated in FIG. 3.

Example 6

—Preparation of Oxide-Forming-Coating Liquid—

1.51 g of yttrium chloride (product number 259-00272, available from Wako Pure Chemical Industries, Ltd.), 0.02 g of magnesium chloride (product number 136-03995, available from Wako Pure Chemical Industries, Ltd.), and 0.10 g of hafnium chloride (product number 083-06931, available from Wako Pure Chemical Industries, Ltd.) were mixed in 9 mL of ultra pure water (product number 95305-1L, available from Sigma-Aldrich) and 9 mL of ethanol (product number 14033-02, available from KANTO CHEMICAL CO., INC.), to thereby obtain an oxide-forming-coating liquid. In Example 6, a pipe of SUS304 was used to feed the water and ethanol each serving as a solvent, in order to confirm effects of heavy metal elements (Fe, Cu, Mn, and Ni) on the oxide-forming-coating liquid. The preparation of the oxide-forming-coating liquid in Example 6 was conducted in a clean room of class 1000.

<Production of Field-Effect Transistor>

Next, the oxide-forming-coating liquid was used in the same manner as in Example 2, to thereby produce a top contact/top gate field-effect transistor as illustrated in FIG. 2D.

<Production of Capacitor for Evaluation of Insulation Property>

Next, the oxide-forming-coating liquid was used in the same manner as in Example 2, to thereby produce a capacitor having the structure illustrated in FIG. 3.

Example 7

—Preparation of Oxide-Forming-Coating Liquid—

9 mL of methanol (product number 25183-08, available from KANTO CHEMICAL CO., INC.), 9 mL of ethylene glycol monoisopropyl ether (product number 20223-02, available from KANTO CHEMICAL CO., INC.), 1.15 g of lanthanum nitrate (product number 128-01732, available from Wako Pure Chemical Industries, Ltd., purity 95%), 0.08 g of calcium nitrate (product number 030482, available from Alfa Aesar, purity 99.98%), and 0.06 g of zirconium chloride (product number 265-00672, available from Wako Pure Chemical Industries, Ltd.) were mixed to obtain an oxide-forming-coating liquid. The preparation of the oxide-forming-coating liquid in Example 7 was conducted in a clean room of class 1000.

<Production of Field-Effect Transistor>

Next, the oxide-forming-coating liquid was used in the same manner as in Example 3, to thereby produce a bottom contact/top gate field-effect transistor as illustrated in FIG. 2C.

<Production of Capacitor for Evaluation of Insulation Property>

Next, the oxide-forming-coating liquid was used in the same manner as in Example 3, to thereby produce a capacitor having the structure illustrated in FIG. 3.

Example 8

—Preparation of Oxide-Forming-Coating Liquid—

9 mL of methanol (product number 25183-08, available from KANTO CHEMICAL CO., INC.), 9 mL of ethylene glycol monoisopropyl ether (product number 20223-02, available from KANTO CHEMICAL CO., INC.), 1.15 g of lanthanum nitrate (product number 011267, available from Alfa Aesar, purity 99.99%), 0.08 g of calcium nitrate (product number 036-0745, available from Wako Pure Chemical Industries, Ltd., purity 98%), and 0.06 g of zirconium chloride (product number 265-00672, available from Wako Pure Chemical Industries, Ltd.) were mixed to obtain an oxide-forming-coating liquid. The preparation of the oxide-forming-coating liquid in Example 8 was conducted in a clean room of class 1000.

<Production of Field-Effect Transistor>

Next, the oxide-forming-coating liquid was used in the same manner as in Example 3, to thereby produce a bottom contact/top gate field-effect transistor as illustrated in FIG. 2C.

<Production of Capacitor for Evaluation of Insulation Property>

Next, the oxide-forming-coating liquid was used in the same manner as in Example 3, to thereby produce a capacitor having the structure illustrated in FIG. 3.

Example 9

—Preparation of Oxide-Forming-Coating Liquid—

0.54 mL of scandium(III) tris(2,2,6,6-tetramethyl 3,5-heptanedionate) (product number 517607, available from Sigma-Aldrich) and 0.41 mL of a barium 2-ethylhexanoate toluene solution (Ba content: 8 wt %, product number 021-09471, available from Wako Pure Chemical Industries, Ltd.) were mixed in 1.2 mL of toluene (product number 40180-80, available from KANTO CHEMICAL CO., INC., CICA 1st grade), to thereby obtain an oxide-forming-coating liquid. The preparation of the oxide-forming-coating liquid in Example 9 was conducted in a clean room of class 1000.

<Production of Field-Effect Transistor>

Next, the oxide-forming-coating liquid was used in the same manner as in Example 4, to thereby produce a top contact/bottom gate field-effect transistor as illustrated in FIG. 2B.

<Production of Capacitor for Evaluation of Insulation Property>

Next, the oxide-forming-coating liquid was used in the same manner as in Example 4, to thereby produce a capacitor having the structure illustrated in FIG. 3.

Example 10

—Preparation of Oxide-Forming-Coating Liquid—

0.6 mL of toluene (product number 40180-79, available from KANTO CHEMICAL CO., INC., PrimePure grade), 0.20 g of samarium acetylacetonate trihydrate (product number 93-6226, available from Strem, Co.), 0.03 mL of a magnesium 2-ethylhexanoate toluene solution (Mg content: 3 wt %, product number 12-1260, available from Strem, Co.), and 0.10 mL of a zirconium 2-ethylhexanoate oxide solution (Zr content: 12 wt %, product number 269-01116, available from Wako Pure Chemical Industries, Ltd.) were mixed in 0.6 mL of cyclohexylbenzene (product number 07560-00, available from KANTO CHEMICAL CO., INC.) to obtain an oxide-forming-coating liquid. The preparation of the oxide-forming-coating liquid in Example 10 was conducted in a draft chamber in a general laboratory. The draft chamber of the general laboratory was an environment where particles having a size of 0.5 μm or more were about 1×10⁵ in a volume of 0.028 m³.

Next, a bottom contact/bottom gate field-effect transistor as illustrated in FIG. 2A was produced.
<Production of Field-Effect Transistor>
—Formation of Gate Electrode—

First, a gate electrode 92 was formed on a glass substrate (base 91). Specifically, a Mo (molybdenum) film was formed on the glass substrate (base 91) by DC sputtering so as to have an average film thickness of about 100 nm. Thereafter, a photoresist was coated thereon, and the resultant was subjected to prebaking, exposure by an exposing device, and developing, to thereby form a resist pattern having the same pattern as that of the gate electrode 92 to be formed. Moreover, resist-pattern-free regions of the Mo film were removed by reactive ion etching (RIE). Thereafter, the resist pattern was also removed to form the gate electrode 92 formed of the Mo film.
—Formation of Gate Insulating Layer—

Next, 0.6 mL of the oxide-forming-coating liquid was dropped onto the substrate and spin-coated under predetermined conditions (rotating at 500 rpm for 5 seconds and then rotating at 3,000 rpm for 20 seconds, and stopping the rotation so as to be 0 rpm in 5 seconds). Subsequently, the resultant was dried at 120° C. for 1 hour in the atmosphere and then baked at 400° C. for 3 hours in an $O_2$ atmosphere, to thereby form an oxide film. Thereafter, a photoresist was coated on the oxide film, and the resultant was subjected to prebaking, exposure by an exposing device, and developing, to thereby form a resist pattern having the same pattern as that of a gate insulating layer 93 to be formed. Moreover, resist-pattern-free regions of the oxide film were removed by wet etching with hydrochloric acid. Thereafter, the resist pattern was also removed to form the gate insulating layer 93. The average film thickness of the gate insulating layer was found to be about 137 nm.
—Formation of Source Electrode and Drain Electrode—

Next, a source electrode 94 and a drain electrode 95 were formed on the gate insulating layer 93. Specifically, a Mo (molybdenum) film was formed on the gate insulating layer 93 by DC sputtering so as to have an average film thickness of about 100 nm. Thereafter, a photoresist was coated on the Mo film, and the resultant was subjected to prebaking, exposure by an exposing device, and developing, to thereby form a resist pattern having the same pattern as that of the source electrode 94 and the drain electrode 95 to be formed. Moreover, resist-pattern-free regions of the Mo film were removed by RIE. Thereafter, the resist pattern was also removed to form the source electrode 94 and the drain electrode 95, each of which was formed of the Mo film.
—Formation of Oxide Semiconductor Layer—

Next, an oxide semiconductor layer 96 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebaking, exposure by an exposing device, and developing, to form a resist pattern having the same pattern as that of the oxide semiconductor layer 96 to be formed. Moreover, resist-pattern-free regions of the Mg—In based oxide film were removed by wet etching. Thereafter, the resist pattern was also removed to form the oxide semiconductor layer 96. As a result, the oxide semiconductor layer 96 was formed in a manner that a channel was formed between the source electrode 94 and the drain electrode 95.

Finally, the resultant was subjected to a heat treatment at 300° C. for 1 hour in the atmosphere as a heat treatment of a post treatment, to thereby complete a field-effect transistor.
<Production of Capacitor for Evaluation of Insulation Property>

Next, a capacitor having the structure illustrated in FIG. 3 was produced. Specifically, an Al (aluminum) film was formed on a glass substrate (base 101) by a vacuum vapor deposition method so as to have an average film thickness of about 100 nm using a metal mask having an opening in the region where a lower electrode 102 was to be formed. By the method described in the formation of the gate insulating layer of the field effect transistor in Example 1, an insulator thin film 103 having an average film thickness of about 100 nm was formed. Finally, using a metal mask having an opening in the region where an upper electrode 104 was to be formed, an Al film was formed by a vacuum vapor deposition method so as to have an average film thickness of about 100 nm, to thereby complete a capacitor.

Example 11

—Preparation of Oxide-Forming-Coating Liquid—

1.0 mL of ultra pure water (product number 95305-1L, available from Sigma-Aldrich), 0.3 mL of ethylene glycol monoisopropyl ether (product number 20223-02, available from KANTO CHEMICAL CO., INC.), 0.02 g of yttrium chloride (product number 259-00272, available from Wako Pure Chemical Industries, Ltd.), 0.07 g of lanthanum nitrate (product number 011267, available from Alfa Aesar, purity 99.99%), 0.01 g of magnesium chloride (product number 136-03995, available from Wako Pure Chemical Industries, Ltd.), and 0.02 g of zirconium chloride (product number 265-00672, available from Wako Pure Chemical Industries, Ltd.) were mixed to obtain an oxide-forming-coating liquid. The preparation of the oxide-forming-coating liquid in Example 11 was conducted in a draft chamber in a general laboratory. The draft chamber of the general laboratory was an environment where particles having a size of 0.5 μm or more were about 1×10⁵ in a volume of 0.028 m³.

Next, a top contact/bottom gate field-effect transistor as illustrated in FIG. 2B was produced.
<Production of Field-Effect Transistor>
—Formation of Gate Electrode—

First, a gate electrode 92 was formed on a glass substrate (base 91). Specifically, a Mo (molybdenum) film was formed on the glass substrate (base 91) by DC sputtering so as to have an average film thickness of about 100 nm. Thereafter, a photoresist was coated on the Mo film, and the resultant was subjected to prebaking, exposure by an exposing device, and developing, to thereby form a resist pattern having the same pattern as that of the gate electrode 92 to be formed. Moreover, resist-pattern-free regions of the Mo film were removed by etching. Thereafter, the resist pattern was also removed to form the gate electrode 92 formed of the Mo film.
—Formation of Gate Insulating Layer—

Next, 0.25 mL of the oxide-forming-coating liquid was dropped onto the substrate and spin-coated under predetermined conditions (rotating at 500 rpm for 5 seconds and then rotating at 2,000 rpm for 20 seconds, and stopping the rotation so as to be 0 rpm in 5 seconds). Subsequently, the resultant was dried at 120° C. for 1 hour in the atmosphere and then baked at 400° C. for 3 hours in an $O_2$ atmosphere, to thereby form an oxide film. Thereafter, a photoresist was coated on the oxide film, and the resultant was subjected to prebaking, exposure by an exposing device, and developing, to thereby form a resist pattern having the same pattern as that of a gate insulating layer 93 to be formed. Moreover, resist-pattern-free regions of the oxide film were removed by wet etching with hydrochloric acid. Thereafter, the resist pattern was also removed to form the gate insulating layer 93. The average film thickness of the gate insulating layer was found to be about 116 nm.

—Formation of Oxide Semiconductor Layer—

Next, an oxide semiconductor layer 96 was formed. Specifically, an In—Ga—Zn based oxide film was formed by DC sputtering so as to have an average film thickness of about 100 nm. Thereafter, a photoresist was coated on the In—Ga—Zn based oxide film, and the resultant was subjected to prebaking, exposure by an exposing device, and developing, to form a resist pattern having the same pattern as that of the oxide semiconductor layer 96 to be formed. Moreover, resist-pattern-free regions of the In—Ga—Zn based oxide film were removed by etching. Thereafter, the resist pattern was also removed to form the oxide semiconductor layer 96.

—Formation of Source Electrode and Drain Electrode—

Next, a source electrode 94 and a drain electrode 95 were formed on the gate insulating layer 93 and the oxide semiconductor layer. Specifically, a Mo (molybdenum) film was formed on the gate insulating layer 93 by DC sputtering so as to have an average film thickness of about 100 nm. Thereafter, a photoresist was coated on the Mo film, and the resultant was subjected to prebaking, exposure by an exposing device, and developing, to form a resist pattern having the same pattern as that of the source electrode 94 and the drain electrode 95 to be formed. Moreover, resist-pattern-free regions of the Mo film were removed by etching. Thereafter, the resist pattern was also removed to form the source electrode 94 and the drain electrode 95, each of which was formed of the Mo film. As a result, the source electrode 94 and the drain electrode 95 were formed in a manner that a channel was formed on the oxide semiconductor layer 96.

Finally, the resultant was subjected to a heat treatment at 300° C. for 1 hour in the atmosphere as a heat treatment of a post treatment, to thereby complete a field-effect transistor.

<Production of Capacitor for Evaluation of Insulation Property>

Next, a capacitor having the structure illustrated in FIG. 3 was produced. Specifically, an Al (aluminum) film was formed on a glass substrate (base 101) by a vacuum vapor deposition method so as to have an average film thickness of about 100 nm using a metal mask having an opening in the region where a lower electrode 102 was to be formed. By the method described in the formation of the gate insulating layer of the field effect transistor in Example 4, an insulator thin film 103 having an average film thickness of about 62 nm was formed. Finally, using a metal mask having an opening in the region where an upper electrode 104 was to be formed, an Al film was formed by a vacuum vapor deposition method so as to have an average film thickness of about 100 mn, to thereby complete a capacitor.

Comparative Example 1

—Preparation of Oxide-Forming-Coating Liquid—

2.17 mL of lanthanum 2-ethylhexanoate (product number 128-03371, available from Wako Pure Chemical Industries, Ltd.) and 0.63 mL of strontium 2-ethylhexanoate (product number 195-09561, available from Wako Pure Chemical Industries, Ltd.) were mixed in 1.2 mL of cyclohexylbenzene (product number 07560-00, available from KANTO CHEMICAL CO., INC.), to thereby obtain an oxide-forming-coating liquid. The preparation of the oxide-forming-coating liquid in Comparative Example 1 was conducted in a general laboratory. The general laboratory was an environment where particles having a size of 0.5 μm or more were about $1 \times 10^7$ in a volume of 0.028 m$^3$.

<Production of Field-Effect Transistor>

Next, the oxide-forming-coating liquid was used in the same manner as in Example 1, to thereby produce a bottom contact/bottom gate field-effect transistor as illustrated in FIG. 2A.

<Production of Capacitor for Evaluation of Insulation Property>

Next, the oxide-forming-coating liquid was used in the same manner as in Example 1, to thereby produce a capacitor having the structure illustrated in FIG. 3.

Comparative Example 2

—Preparation of Oxide-Forming-Coating Liquid—

9 mL of methanol (product number 25183-08, available from KANTO CHEMICAL CO., INC.), 9 mL of ethylene glycol monoisopropyl ether (product number 20223-02, available from KANTO CHEMICAL CO., INC.), 1.15 g of lanthanum nitrate (product number 128-01732, available from Wako Pure Chemical Industries, Ltd., purity 95%), 0.08 g of calcium nitrate (product number 036-0745, available from Wako Pure Chemical Industries, Ltd., purity 98%), and 0.06 g of zirconium chloride (product number 265-00672, available from Wako Pure Chemical Industries, Ltd.) were mixed to obtain an oxide-forming-coating liquid. The preparation of the oxide-forming-coating liquid in Comparative Example 2 was conducted in a general laboratory. The general laboratory was an environment where particles having a size of 0.5 μm or more were about $1 \times 10^7$ in a volume of 0.028 m$^3$.

<Production of Field-Effect Transistor>

Next, the oxide-forming-coating liquid was used in the same manner as in Example 3, to thereby produce a bottom contact/top gate field-effect transistor as illustrated in FIG. 2C.

<Production of Capacitor for Evaluation of Insulation Property>

Next, the oxide-forming-coating liquid was used in the same manner as in Example 3, to thereby produce a capacitor having the structure illustrated in FIG. 3.

Comparative Example 3

—Preparation of Oxide-Forming-Coating Liquid—

0.54 mL of scandium(III) tris(2,2,6,6-tetramethyl 3,5-heptaneclionate) (product number 517607, available from Sigma-Aldrich) and 0.41 mL of a barium 2-ethylhexanoate toluene solution (Ba content: 8 wt%, product number 021-09471, available from Wako Pure Chemical Industries, Ltd.) were mixed in 1.2 mL of toluene (product number 40180-80, available from KANTO CHEMICAL CO., INC., CICA 1st grade), to thereby obtain an oxide-forming-coating liquid. The preparation of the oxide-forming-coating liquid in Comparative Example 3 was conducted in a general laboratory. The general laboratory was an environment where particles having a size of 0.5 μm or more were about $1 \times 10^7$ in a volume of 0.028 m$^3$.

<Production of Field-Effect Transistor>

Next, the oxide-forming-coating liquid was used in the same manner as in Example 4, to thereby produce a top contact/bottom gate field-effect transistor as illustrated in FIG. 2B.

<Production of Capacitor for Evaluation of Insulation Property>

Next, the oxide-forming-coating liquid was used in the same manner as in Example 4, to thereby produce a capacitor having the structure illustrated in FIG. 3.

<Evaluation of Impurity Concentration of Oxide-Forming-Coating Liquid>

The concentrations of Na and K in the oxide-forming-coating liquids prepared in Examples 1 to 11 and Comparative Examples 1 to 3 were evaluated using an atomic absorption spectrometer (product number ZA3300, available from Hitachi High-Tech Science Corporation). The concentrations of Cr, Mn, Fe, Co, Ni, and Cu in the oxide-forming-coating liquids prepared in Examples 1 to 11 and Comparative Examples 1 to 3 were evaluated using an ICP-OES apparatus (product number ICAP6300-DUO, available from Thermo Fisher Scientific). The results are presented in Table 1. In Table 1, the measurements accompanied with "<" indicate that the concentrations of the relevant elements were below the detection limit of the apparatus.

The detection limit was obtained in the following manner. Specifically, the ultra pure water (product number 95305-1L, available from Sigma-Aldrich), which was the solvent used for diluting the oxide-forming-coating liquid in the present evaluation, was repeatedly measured 10 times using the atomic absorption spectrometer and the ICP-OES apparatus. The standard deviation of the obtained concentration values was tripled, and the obtained value was used as the detection limit The total of concentrations of the A element ($C_A$ mg/L) and the total of concentrations of the B element ($C_B$ mg/L) in the oxide-forming-coating liquids prepared in Examples 1 to 11 and Comparative Examples 1 to 3 were evaluated using an ICP-OES apparatus (product number ICAP6300-DUO, available from Thermo Fisher Scientific). The results are presented in Table 2.

From Table 2, the total of concentrations of Na and K detected from each of the oxide-forming-coating liquids of Examples 1 to 11 was $(C_A+C_B)/10^3$ mg/L or less as a value calculated from the total of concentrations of the A element ($C_A$ mg/L) and the total of concentrations of the B element ($C_B$ mg/L). Meanwhile, the total of concentrations of Na and K detected from each of the oxide-forming-coating liquids of Comparative Examples 1 to 3 was more than $(C_A+C_B)/10^3$ mg/L.

Also, from Table 2, the total of concentrations of Cr, Mn, Fe, Co, Ni, and Cu detected from each of the oxide-forming-coating liquids of Examples 1 to 11 was $(C_A+C_B)/10^3$ mg/L or less. Meanwhile, the total of concentrations of Cr, Mn, Fe, Co, Ni, and Cu detected from each of the oxide-forming-coating liquids of Comparative Examples 1 to 3 was more than $(C_A+C_B)/10^3$ mg/L.

From Table 2, the total of concentrations of Na and K detected from each of the oxide-forming-coating liquids of Examples 1 to 4, 6, 8, and 9 was $(C_A+C_B)/10^6$ mg/L or less as a value calculated from the total of concentrations of the A element ($C_A$ mg/L) and the total of concentrations of the B element ($C_B$ mg/L). Meanwhile, the total of concentrations of Na and K detected from each of the oxide-forming-coating liquids of Examples 5, 7, 10, and 11 and Comparative Examples 1 to 3 was more than $(C_A+C_B)/10^6$ mg/L.

Also, from Table 2, the total of concentrations of Cr, Mn, Fe, Co, Ni, and Cu detected from each of the oxide-forming-coating liquids of Examples 1 to 5 was $(C_A+C_B)/10^6$ mg/L or less as a value calculated from the total of concentrations of the A element ($C_A$ mg/L) and the total of concentrations of the B element ($C_B$ mg/L). Meanwhile, the total of concentrations of Cr, Mn, Fe, Co, Ni, and Cu detected from each of the oxide-forming-coating liquids of Examples 6 to 11 and Comparative Examples 1 to 3 was more than $(C_A+C_B)/10^6$ mg/L.

<Evaluation of Impurity Concentration of Oxide Film Formed using Oxide-Forming-Coating Liquid>

The concentrations of Na and K in the oxide film formed using the oxide-forming-coating liquids prepared in Examples 1 to 11 and Comparative Examples 1 to 3 were evaluated using an atomic absorption spectrometer (product number ZA3300, available from Hitachi High-Tech Science Corporation). The concentrations of Cr, Mn, Fe, Co, Ni, and Cu in the oxide-forming-coating liquids prepared in Examples 1 to 11 and Comparative Examples 1 to 3 were evaluated using an ICP-OES apparatus (product number ICAP6300-DUO, available from Thermo Fisher Scientific). Specifically, 0.25 mL to 0.60 mL of each of the oxide-forming-coating liquids prepared in Examples 1 to 11 and Comparative Examples 1 to 3 was dropped onto a glass substrate and spin-coated under predetermined conditions (for example, rotating at 500 rpm for 5 seconds and then rotating at 3,000 rpm for 20 seconds, and stopping the rotation so as to be 0 rpm in 5 seconds). Subsequently, the resultant was dried at 120° C. for 1 hour in the atmosphere and then baked at 400° C. for 3 hours in an $O_2$ atmosphere, to thereby form an oxide film. Subsequently, the concentrations of Na, K, Cr, Mn, Fe, Co, Ni, and Cu in the oxide film were measured by dissolving the oxide film in an acidic aqueous solution and subjecting the resultant solution to measurement of impurity concentrations using an atomic absorption spectrometer and an ICP-OES apparatus. The results are presented in Table 3. In Table 3, the measurements accompanied with "<" indicate that the concentrations of the relevant elements were below the detection limit of the apparatus.

In Table 3, the reason why the value of detection limit of each element is about 50-fold higher than that in Table 1 is that a sample obtained by about 50-fold diluting the acidic aqueous solution was used for the analysis.

The value of detection limit can be varied depending on the formulation or concentration of the oxide-forming-coating liquid. Therefore, regarding the same element, the detected value in a certain coating liquid can be below the detection limit in another coating liquid (for example, in Table 3, Co (cobalt) in Example 1 is "<0.05" mg/kg, whereas Co (cobalt) in Example 5 is "0.03" mg/kg).

From Table 4, the total of concentrations of Na and K detected from each of the oxide films of Examples 1 to 11 was 1,000 mg/kg or less. Meanwhile, the total of impurity concentrations of Na and K detected from each of the oxide films of Comparative Examples 1 to 3 was more than 1,000 mg/kg.

Also, from Table 4, the total of concentrations of Cr, Mn, Fe, Co, and Ni detected from each of the oxide films of Examples 1 to 11 was 1,000 mg/kg or less. Meanwhile, the total of impurity concentrations of Cr, Mn, Fe, Co, and Ni detected from each of the oxide films of Comparative Examples 1 to 3 was more than 1,000 mg/kg.

From Table 4, the total of concentrations of Na and K detected from each of the oxide films of Examples 1 to 4, 6, and 9 was 1,000 μg/kg or less. Meanwhile, the total of impurity concentrations of Na and K detected from each of the oxide films of Examples 5, 7, 8, 10, and 11 and Comparative Examples 1 to 3 was more than 1,000 µg/kg.

Also, from Table 4, the total of concentrations of Cr, Mn, Fe, Co, and Ni detected from each of the oxide films of Examples 1 to 5 was 1,000 µm/kg or less. Meanwhile, the total of concentrations of Cr, Mn, Fe, Co, and Ni detected from each of the oxide films of Examples 6 to 11 and Comparative Examples 1 to 3 was more than 1,000 µg/kg.

<Evaluation of Foreign Matter and Etching Residues of Oxide Film Formed from Oxide-Forming-Coating Liquid>

Regarding each of the field effect transistors produced in Examples 1 to 11 and Comparative Examples 1 to 3, after the formation of the gate insulating layer, foreign matter in the oxide film formed from the oxide-forming-coating liquid and etching residues in etched portions of the oxide film formed from the oxide-forming-coating liquid were evaluated under a microscope (product number DM8000M, available from Leica).

Observation conditions under the microscope were that for one sample, 10 portions were observed under bright field observation at a magnification of ×50 and 10 portions were observed under dark field observation at a magnification of ×50. For each of Examples 1 to 11 and Comparative Examples 1 to 3, 12 samples of the field-effect transistor (12 substrates) were produced and observed under the microscope.

Table 5 presents the number of samples having foreign matter and etching residues confirmed by microscopic observation in the oxide films in the 12 samples of the field-effect transistor produced for each of Examples 1 to 11 and Comparative Examples 1 to 3.

From Table 5, no foreign matter was observed under bright field observation in the oxide films formed from the oxide-forming-coating liquids of Examples 1 to 11. Meanwhile, foreign matter was observed under bright field observation in the oxide films formed from the oxide-forming-coating liquids of Comparative Examples 1 to 3.

From Table 5, no etching residue was found under bright field observation in the etched portions of the oxide films formed from the oxide-forming-coating liquids of Examples 1 to 11. Meanwhile, etching residues were confirmed in the etched portions of the oxide films formed in Comparative Examples 1 to 3. The etching residues mean that the film and the like remain in an unintended portion. That is, the sample in which the etching residues were observed can be said to involve pattern failure.

<Evaluation of Insulation Property of Oxide Film Formed from Oxide-Forming-Coating Liquid>

The capacitors produced in Examples 1 to 11 and Comparative Examples 1 to 3 were measured for breakdown voltage using a semiconductor device-parameter-analyzer (31500A, available from Agilent Co.).

The breakdown voltage test was performed until a change of current density had reached an inflection point in a graph obtained by plotting current density in A/cm$^2$ relative to electrical field intensity in MV/cm by gradually increasing the voltage applied between the upper and lower electrodes of the capacitor (overlapped area: 6.0×10$^{-5}$ cm$^2$). The electrical field intensity in MV/cm at the time when the change of current density had reached the inflection point was evaluated as breakdown voltage.

Table 7 presents the results of the evaluation of the breakdown voltage of each of the capacitors produced in Examples 1 to 11 and Comparative Examples 1 to 3. From Table 7, the capacitors produced in Examples 1 to 11 had high breakdown voltage of 3 MV/cm or more and exhibited excellent insulation property. Meanwhile, the capacitors produced in Comparative Examples 1 to 3 had low breakdown voltage of less than 1 MV/cm, and exhibited poor insulation property.

<Evaluation of Transistor Characteristics of Field-Effect Transistors>

Transistor characteristics of the field-effect transistors produced in Examples 1 to 11 and Comparative Examples 1 to 3 were evaluated using a semiconductor device-parameter-analyzer (B1500A, available from Agilent Co.). The transistor characteristics were evaluated by measuring a relationship (Vgs-Ids) between the voltage (Vgs) between the gate electrode 92 and the source electrode 94 and the current (Ids) between the drain electrode 95 and the source electrode 94, and a relationship (Vgs-Igs) between the voltage (Vgs) between the gate electrode 92 and the source electrode 94 and the current (Igs) between the gate electrode 92 and the source electrode 94, when the voltage (Vds) between the drain electrode 95 and the source electrode 94 was +1 V. Also, the Vgs-Ids and the Vgs-Igs were measured by changing the Vgs under the following two conditions.

(1) Vgs from −5V to +5V (1V Step)

(2) Vgs from −30V to +30V (1V Step)

A field-effect mobility in a saturated region was calculated from the evaluation result of the transistor characteristics (Vgs-Ids). The value of the gate current (Igs) at a Vgs of −5 V was evaluated as an index of insulation property of the gate insulating film in the transistor structure. An Ids ratio (on/off ratio) of an on-state (e.g., Vgs=+10 V) to an off-state (e.g., Vgs=−10 V) of the transistor was calculated. A sub-threshold swing (SS) was calculated as an index for sharpness of the rise of Ids upon the application of Vgs. Furthermore, threshold voltage (Vth) was calculated as a voltage value at the time of the rise of Ids upon the application of Vgs.

Table 6 presents the evaluation results of the transistor characteristics when the Vgs was changed in the range of from −30 V to +30 V. Regarding the field-effect transistors produced in Examples 5, 7, 8, 10, and 11, the drain current Ids flowing the transistor when the Vgs was applied up to +30 V exceeded 1 mA, and the semiconductor was broken and was impossible to measure. The applied voltage of Vgs from −30 V to +30 V was high and was inappropriate conditions. Thus, the transistor characteristics in the present disclosure were evaluated at the applied voltage of Vgs from −5 V to +5 V.

Also, regarding the field-effect transistors produced in Comparative Examples 1 to 3, the gate current Igs flowing the transistor when the Vgs was applied up to +30 V was high, and the gate insulating film was broken and was impossible to measure.

Table 7 presents the evaluation results of the transistor characteristics when the Vgs was changed in the range of from −5 V to +5 V. From Table 7, the field-effect transistors produced in Examples 1 to 11 had a high mobility of 8 cm$^2$/Vs, a low gate current of 10×10$^{-12}$ A or lower, a high on/off ratio of 10$^8$ or more, a low SS of 0.5 V/decade, and a Vth of within ±5 V, exhibiting good transistor characteristics. Meanwhile, the field-effect transistors produced in comparative examples had a high gate current of 10$^{-10}$ A or higher, indicating that the gate insulating film had low insulation property.

TABLE 1

|  | Na mg/L | K mg/L | Cr mg/L | Mn mg/L | Fe mg/L | Co mg/L | Ni mg/L | Cu mg/L |
|---|---|---|---|---|---|---|---|---|
| Ex. 1 | 0.003 | 0.001 | <0.001 | 0.001 | <0.002 | <0.001 | <0.001 | <0.001 |
| Ex. 2 | 0.002 | 0.001 | <0.001 | <0.001 | <0.002 | <0.001 | <0.001 | <0.001 |
| Ex. 3 | 0.002 | 0.001 | 0.004 | <0.001 | <0.002 | <0.001 | <0.001 | <0.001 |
| Ex. 4 | 0.001 | 0.001 | 0.001 | 0.001 | 0.002 | 0.001 | 0.001 | 0.001 |
| Ex. 5 | 0.432 | 3.597 | 0.001 | 0.001 | 0.007 | 0.001 | 0.001 | 0.001 |
| Ex. 6 | 0.003 | 0.005 | 0.034 | 0.017 | 0.135 | 0.008 | 0.025 | 0.012 |
| Ex. 7 | 0.091 | 0.055 | 0.055 | 0.091 | 0.165 | 0.146 | 0.055 | 0.073 |
| Ex. 8 | 0.018 | 0.009 | 0.055 | 0.055 | 0.101 | 0.018 | 0.037 | 0.027 |
| Ex. 9 | 0.001 | 0.002 | 0.017 | 0.033 | 0.017 | 0.008 | 0.005 | 0.017 |
| Ex. 10 | 3.663 | 8.324 | 0.516 | 1.998 | 6.326 | 0.832 | 0.599 | 0.166 |
| Ex. 11 | 0.866 | 0.982 | 1.448 | 1.498 | 2.164 | 0.516 | 0.216 | 0.083 |
| Comp. Ex. 1 | 84.906 | 21.643 | 31.632 | 43.285 | 51.609 | 24.972 | 13.319 | 8.324 |
| Comp. Ex. 2 | 19.978 | 54.939 | 24.972 | 138.180 | 41.621 | 29.967 | 51.609 | 38.291 |
| Comp. Ex. 3 | 41.621 | 113.208 | 84.906 | 48.280 | 63.263 | 34.961 | 66.593 | 88.236 |

TABLE 2

|  | $C_A + C_B$ mg/L | $(C_A + C_B)/(1 \times 10^3)$ mg/L | $(C_A + C_B)/(1 \times 10^6)$ mg/L | Na + K mg/L | Cr + Mn + Fe + Co + Ni + Cu mg/L |
|---|---|---|---|---|---|
| Ex. 1 | $3.8 \times 10^4$ | 38 | 0.038 | 0.004 | 0.001 |
| Ex. 2 | $2.6 \times 10^4$ | 26 | 0.026 | 0.003 | 0.000 |
| Ex. 3 | $4.0 \times 10^4$ | 40 | 0.040 | 0.002 | 0.004 |
| Ex. 4 | $3.4 \times 10^4$ | 34 | 0.034 | 0.002 | 0.008 |
| Ex. 5 | $3.8 \times 10^4$ | 38 | 0.038 | 4.028 | 0.012 |
| Ex. 6 | $2.6 \times 10^4$ | 26 | 0.026 | 0.008 | 0.232 |
| Ex. 7 | $4.0 \times 10^4$ | 40 | 0.040 | 0.146 | 0.585 |
| Ex. 8 | $4.0 \times 10^4$ | 40 | 0.040 | 0.027 | 0.293 |
| Ex. 9 | $3.4 \times 10^4$ | 34 | 0.034 | 0.003 | 0.096 |
| Ex. 10 | $4.5 \times 10^4$ | 44 | 0.044 | 11.987 | 10.438 |
| Ex. 11 | $3.1 \times 10^4$ | 38 | 0.038 | 1.848 | 5.927 |
| Comp. Ex. 1 | $3.8 \times 10^4$ | 38 | 0.038 | 106.549 | 173.141 |
| Comp. Ex. 2 | $4.0 \times 10^4$ | 40 | 0.040 | 74.917 | 324.640 |
| Comp. Ex. 3 | $3.4 \times 10^4$ | 34 | 0.034 | 154.828 | 386.239 |

TABLE 3

|  | Na mg/kg | K mg/kg | Cr mg/kg | Mn mg/kg | Fe mg/kg | Co mg/kg | Ni mg/kg | Cu mg/kg |
|---|---|---|---|---|---|---|---|---|
| Ex. 1 | 0.200 | 0.100 | <0.050 | 0.050 | <0.050 | <0.050 | <0.050 | <0.050 |
| Ex. 2 | 0.100 | 0.050 | <0.050 | <0.050 | <0.050 | <0.050 | <0.050 | <0.050 |
| Ex. 3 | 0.100 | 0.030 | 0.200 | <0.050 | <0.050 | <0.050 | <0.050 | <0.050 |
| Ex. 4 | 0.050 | 0.090 | 0.050 | 0.060 | 0.100 | 0.090 | 0.080 | 0.090 |
| Ex. 5 | 30.000 | 250.000 | 0.020 | 0.100 | 0.500 | 0.030 | 0.020 | 0.040 |
| Ex. 6 | 0.200 | 0.300 | 2.000 | 1.000 | 8.000 | 0.500 | 1.500 | 0.700 |
| Ex. 7 | 5.000 | 3.000 | 3.000 | 5.000 | 9.000 | 8.000 | 3.000 | 4.000 |
| Ex. 8 | 1.000 | 0.500 | 3.000 | 3.000 | 5.500 | 1.000 | 2.000 | 1.500 |
| Ex. 9 | 0.070 | 0.100 | 1.000 | 2.000 | 1.000 | 0.500 | 0.300 | 1.000 |
| Ex. 10 | 220.000 | 500.000 | 31.000 | 120.000 | 380.000 | 50.000 | 36.000 | 10.000 |
| Ex. 11 | 52.000 | 59.000 | 87.000 | 90.000 | 130.000 | 31.000 | 13.000 | 5.000 |
| Comp. Ex. 1 | 5100.000 | 1300.000 | 1900.000 | 2600.000 | 3100.000 | 1500.000 | 800.000 | 500.000 |
| Comp. Ex. 2 | 1200.000 | 3300.000 | 1500.000 | 8300.000 | 2500.000 | 1800.000 | 3100.000 | 2300.000 |
| Comp. Ex. 3 | 2500.000 | 6800.000 | 5100.000 | 2900.000 | 3800.000 | 2100.000 | 4000.000 | 5300.000 |

TABLE 4

|  | Na + K mg/kg | Cr + Mn + Fe + Co + Ni + Cu mg/kg | Na + K μg/kg | Cr + Mn + Fe + Co + Ni + Cu μg/kg |
|---|---|---|---|---|
| Ex. 1 | 0.300 | 0.050 | 300.000 | 50.000 |
| Ex. 2 | 0.150 | 0.000 | 150.000 | 0.000 |
| Ex. 3 | 0.130 | 0.200 | 130.000 | 200.000 |
| Ex. 4 | 0.140 | 0.470 | 140.000 | 470.000 |
| Ex. 5 | 280.000 | 0.710 | 280000.000 | 710.000 |
| Ex. 6 | 0.500 | 13.700 | 500.000 | 13700.000 |
| Ex. 7 | 8.000 | 32.000 | 8000.000 | 32000.000 |
| Ex. 8 | 1.500 | 16.000 | 1500.000 | 16000.000 |
| Ex. 9 | 0.170 | 5.800 | 170.000 | 5800.000 |
| Ex. 10 | 720.000 | 627.000 | 720000.000 | 627000.000 |
| Ex. 11 | 111.000 | 356.000 | 111000.000 | 356000.000 |
| Comp. Ex. 1 | 6400.000 | 10400.000 | 6400000.000 | 10400000.000 |
| Comp. Ex. 2 | 4500.000 | 19500.000 | 4500000.000 | 19500000.000 |
| Comp. Ex. 3 | 9300.000 | 23200.000 | 9300000.000 | 23200000.000 |

TABLE 5

|  | Number of Samples in which foreign matter was observed in the oxide films | | Number of Samples in which etching residues were observed | |
|---|---|---|---|---|
|  | Bright field | Dark field | Bright field | Dark field |
| Ex. 1 | 0 | 0 | 0 | 0 |
| Ex. 2 | 0 | 0 | 0 | 0 |
| Ex. 3 | 0 | 0 | 0 | 0 |
| Ex. 4 | 0 | 0 | 0 | 0 |
| Ex. 5 | 0 | 1 | 0 | 0 |
| Ex. 6 | 0 | 0 | 0 | 1 |
| Ex. 7 | 0 | 1 | 0 | 1 |
| Ex. 8 | 0 | 1 | 0 | 1 |
| Ex. 9 | 0 | 0 | 0 | 1 |
| Ex. 10 | 0 | 1 | 0 | 2 |
| Ex. 11 | 0 | 1 | 0 | 2 |
| Comp. Ex. 1 | 12 | 12 | 12 | 12 |
| Comp. Ex. 2 | 12 | 12 | 12 | 12 |
| Comp. Ex. 3 | 12 | 12 | 12 | 12 |

TABLE 6

|  | Mobility [cm$^2$/Vs] | Gate current [A] | on/off [×10$^8$] | Subthreshold swing [V/decade] | Vth [V] |
|---|---|---|---|---|---|
| Ex. 1 | 10.8 | 2.1 × 10$^{-14}$ | 9.8 | 0.26 | 2.9 |
| Ex. 2 | 9.7 | 2.6 × 10$^{-14}$ | 9.3 | 0.31 | 4.1 |
| Ex. 3 | 12.1 | 3.0 × 10$^{-14}$ | 10.5 | 0.23 | 3.5 |
| Ex. 4 | 9.2 | 5.2 × 10$^{-14}$ | 8.8 | 0.34 | 3.6 |
| Ex. 5 | Not measurable | Not measurable | Not measurable | Not measurable | Not measurable |
| Ex. 6 | 8.9 | 2.2 × 10$^{-14}$ | 8.8 | 0.41 | 4.5 |
| Ex. 7 | Not measurable | Not measurable | Not measurable | Not measurable | Not measurable |
| Ex. 8 | Not measurable | Not measurable | Not measurable | Not measurable | Not measurable |
| Ex. 9 | 9.5 | 6.5 × 10$^{-14}$ | 9.0 | 0.45 | 3.3 |
| Ex. 10 | Not measurable | Not measurable | Not measurable | Not measurable | Not measurable |
| Ex. 11 | Not measurable | Not measurable | Not measurable | Not measurable | Not measurable |
| Comp. Ex. 1 | Not measurable | Not measurable | Not measurable | Not measurable | Not measurable |
| Comp. Ex. 2 | Not measurable | Not measurable | Not measurable | Not measurable | Not measurable |
| Comp. Ex. 3 | Not measurable | Not measurable | Not measurable | Not measurable | Not measurable |

TABLE 7

|  | Breakdown voltage [MV/cm] | Mobility [cm$^2$/Vs] | Gate current [A] | on/off [×10$^8$] | Subthreshold swing [V/decade] | Vth [V] |
|---|---|---|---|---|---|---|
| Ex. 1 | 4.5 | 10.5 | 2.0 × 10$^{-14}$ | 9.8 | 0.27 | 3.0 |
| Ex. 2 | 4.4 | 9.5 | 2.5 × 10$^{-14}$ | 9.2 | 0.30 | 4.0 |
| Ex. 3 | 4.3 | 12.0 | 3.1 × 10$^{-14}$ | 10.4 | 0.25 | 3.6 |
| Ex. 4 | 4.8 | 9.0 | 5.8 × 10$^{-14}$ | 8.7 | 0.33 | 3.6 |
| Ex. 5 | 3.3 | 9.5 | 4.4 × 10$^{-13}$ | 9.3 | 0.44 | 3.7 |
| Ex. 6 | 4.3 | 9.3 | 1.5 × 10$^{-14}$ | 8.6 | 0.42 | 4.4 |
| Ex. 7 | 3.1 | 8.5 | 2.8 × 10$^{-13}$ | 9.4 | 0.38 | 4.9 |
| Ex. 8 | 4.3 | 9.1 | 1.8 × 10$^{-13}$ | 9.1 | 0.39 | 3.5 |
| Ex. 9 | 4.2 | 9.2 | 8.0 × 10$^{-14}$ | 8.9 | 0.47 | 3.5 |
| Ex. 10 | 3.4 | 8.8 | 6.0 × 10$^{-13}$ | 9.2 | 0.31 | 4.6 |
| Ex. 11 | 3.7 | 8.9 | 3.5 × 10$^{-13}$ | 9.6 | 0.40 | 4.9 |

TABLE 7-continued

|  | Breakdown voltage [MV/cm] | Mobility [cm$^2$/Vs] | Gate current [A] | on/off [×10$^8$] | Subthreshold swing [V/decade] | Vth [V] |
| --- | --- | --- | --- | --- | --- | --- |
| Comp. Ex. 1 | 0.5 | 8.3 | 8.3 × 10$^{-9}$ | 8.8 | 0.35 | 3.6 |
| Comp. Ex. 2 | 0.8 | 8.4 | 2.5 × 10$^{-10}$ | 8.8 | 0.45 | 4.2 |
| Comp. Ex. 3 | 0.3 | 9.0 | 5.8 × 10$^{-10}$ | 9.0 | 0.39 | 3.9 |

Aspects of the present disclosure are, for example, as follows.

<1> A coating liquid for forming an oxide, the coating liquid including;

A element, which is at least one alkaline earth metal; and

B element, which is at least one selected from the group consisting of gallium (Ga), scandium (Sc), yttrium (Y), and lanthanoid, wherein when a total of concentrations of the A element is denoted by $C_A$ mg/L and a total of concentrations of the B element is denoted by $C_B$ mg/L, a total of concentrations of sodium (Na) and potassium (K) in the coating liquid is $(C_A+C_B)/10^3$ mg/L or less and a total of concentrations of chromium (Cr), manganese (Mn), iron (Fe), cobalt (Co), nickel (Ni), and copper (Cu) in the coating liquid is $(C_A+C_B)/10^3$ mg/L or less.

<2> The coating liquid for forming an oxide according to <1>, wherein when the total of concentrations of the A element is denoted by $C_A$ mg/L and the total of concentrations of the B element is denoted by $C_B$ mg/L, the total of concentrations of sodium (Na) and potassium (K) in the coating liquid is $(C_A+C_B)/10^6$ mg/L or less and the total of concentrations of chromium (Cr), manganese (Mn), iron (Fe), cobalt (Co), nickel (Ni), and copper (Cu) in the coating liquid is $(C_A+C_B)/10^6$ mg/L or less.

<3> The coating liquid for forming an oxide according to <1> or <2>, wherein the coating liquid further includes C element, which is at least one selected from the group consisting of Al, Ti, Zr, Hf, Nb, and Ta.

<4> The coating liquid for forming an oxide according to any one of <1> to <3>, wherein the coating liquid includes at least one selected from the group consisting of inorganic salts of the A element or the B element, oxides of the A element or the B element, hydroxides of the A element or the B element, halides of the A element or the B element, metal complexes of the A element or the B element, and organic salts of the A element or the B element.

<5> A coating liquid for forming an oxide, the coating liquid including:

a metal source, which is at least one selected from the group consisting of inorganic salts, oxides, hydroxides, halides, metal complexes, and organic salts; and a solvent, wherein a total of concentrations of sodium (Na) and potassium (K) in an oxide film formed using the coating liquid is 1,000 mg/kg or less, and wherein a total of concentrations of chromium (Cr), manganese (Mn), iron (Fe), cobalt (Co), nickel (Ni), and copper (Cu) in the oxide film is 1,000 mg/kg or less.

<6> The coating liquid for forming an oxide according to <5>, wherein the total of concentrations of sodium (Na) and potassium (K) in the oxide film formed using the coating liquid is 1,000 µg/kg or less, and wherein the total of concentrations of chromium (Cr), manganese (Mn), iron (Fe), cobalt (Co), nickel (Ni), and copper (Cu) in the oxide film is 1,000 µg/kg or less.

<7> The coating liquid for forming an oxide according to <5> or <6>, wherein the inorganic salt includes at least one selected from the group consisting of nitrates, sulfates, carbonates, acetates, and phosphates.

<8> The coating liquid for forming an oxide according to any one of <5> to <7>, wherein the halide includes at least one selected from the group consisting of fluorides, chlorides, bromides, and iodides.

<9> The coating liquid for forming an oxide according to any one of <5> to <8>, wherein the organic salt includes at least one selected from the group consisting of carboxylates, carbolic acid, and derivatives thereof. <10> The coating liquid for forming an oxide according to any one of <1> to <9>, wherein the solvent includes at least one selected from the group consisting of organic acids, organic acid esters, aromatic compounds, diols, glycol ethers, polar aprotic solvents, alkane compounds, alkene compounds, ethers, alcohols, and water.

<11> A method for producing an oxide film, the method including:

coating and heat treating the coating liquid for forming an oxide according to any one of <1> to <10>, to obtain the oxide film.

<12> A method for producing a field-effect transistor, the method including:

forming an oxide film using the coating liquid for forming an oxide according to any one of <1> to <10>, wherein the field-effect transistor includes:

a gate electrode;

a source electrode and a drain electrode;

a semiconductor layer; and a gate insulating layer including the oxide film.

What is claimed is:

1. A coating liquid for forming an oxide, the coating liquid comprising:

A element, which is at least one alkaline earth metal; and

B element, which is at least one selected from the group consisting of gallium (Ga), scandium (Sc), yttrium (Y), and lanthanoid, wherein when a total concentration of the A element is denoted by $C_A$ mg/L and a total concentration of the B element is denoted by $C_B$ mg/L, a total of concentrations of sodium (Na) and potassium (K) in the coating liquid is $(C_A+C_B)/10^3$ mg/L or less but not zero and a total of concentrations of chromium (Cr), manganese (Mn), iron (Fe), cobalt (Co), nickel (Ni), and copper (Cu) in the coating liquid is $(C_A+C_B)/10^3$ mg/L or less but not zero.

2. The coating liquid for forming an oxide according to claim 1, wherein when the total concentration of the A element is denoted by $C_A$ mg/L and the total concentration of the B element is denoted by $C_B$ mg/L, the total of concentrations of sodium (Na) and potassium (K) in the coating liquid is $(C_A+C_B)/10^6$ mg/L or less but not zero and the total of concentrations of chromium (Cr), manganese (Mn), iron (Fe), cobalt (Co), nickel (Ni), and copper (Cu) in the coating liquid is $(C_A+C_B)/10^6$ mg/L or less but not zero.

3. The coating liquid for forming an oxide according to claim 1, wherein the coating liquid further comprises C element, which is at least one selected from the group consisting of Al, Ti, Zr, Hf, Nb, and Ta.

4. The coating liquid for forming an oxide according to claim 1, wherein the coating liquid comprises:
   inorganic salts of the A element or the B element,
   oxides of the A element or the B element,
   hydroxides of the A element or the B element,
   halides of the A element or the B element,
   metal complexes of the A element or the B element, or
   organic salts of the A element or the B element.

5. A method for producing an oxide film, the method comprising:
   coating an object with the coating liquid for forming an oxide according to claim 1, thereby forming a coated object, and
   heating the coated object to obtain the oxide film.

6. A method for producing a field-effect transistor, the method comprising:
   forming an oxide film using the coating liquid for forming an oxide according to claim 1, thereby forming a gate insulating layer;
   forming a gate electrode on the gate insulating layer; and
   heating the gate electrode on the gate insulating layer, thereby producing the field-effect transistor.

7. An oxide film, formed by heating a coating liquid, wherein the coating liquid comprises:
   a metal source, which is at least one selected from the group consisting of inorganic salts, oxides, hydroxides, halides, metal complexes, and organic salts, wherein a metal in the metal source is A element, which is at least one alkaline earth metal and B element, which is at least one selected from the group consisting of gallium (Ga), scandium (Sc), yttrium (Y) and lanthanoid; and
   a solvent,
   wherein when a total concentration of the A element is denoted by $C_A$ mg/L and a total concentration of the B element is denoted by $C_B$ mg/L, a total of concentrations of sodium (Na) and potassium (K) in the coating liquid is $(C_A+C_B)/10^3$ mg/kg or less but not zero, and
   wherein a total of concentrations of chromium (Cr), manganese (Mn), iron (Fe), cobalt (Co), nickel (Ni), and copper (Cu) in the coating liquid is $(C_A+C_B)/10^3$ mg/kg or less but not zero.

8. The oxide film according to claim 7, wherein the total of concentrations of sodium (Na) and potassium (K) in coating liquid is $(C_A+C_B)/10^6$ mg/L or less but not zero, and
   wherein the total of concentrations of chromium (Cr), manganese (Mn), iron (Fe), cobalt (Co), nickel (Ni), and copper (Cu) in the oxide film is $(C_A+C_B)/10^6$ mg/L or less but not zero.

9. The oxide film according to claim 7, wherein the inorganic salt comprises at least one selected from the group consisting of nitrates, sulfates, carbonates, acetates, and phosphates.

10. The oxide film according to claim 7, wherein the halide comprises at least one selected from the group consisting of fluorides, chlorides, bromides, and iodides.

11. The oxide film according to claim 7, wherein the organic salt comprises at least one selected from the group consisting of carboxylates, carbolic acid, and derivatives thereof.

12. The oxide film according to claim 7, wherein the solvent comprises at least one selected from the group consisting of organic acids, organic acid esters, aromatic compounds, diols, glycol ethers, polar aprotic solvents, alkane compounds, alkene compounds, ethers, alcohols, and water.

13. A method for producing the oxide film according to claim 7, the method comprising:
   coating an object with the coating liquid for forming an oxide, thereby forming a coated object, and heating the coated object to obtain the oxide film.

14. A method for producing a gate insulating layer, the method comprising:
   forming the oxide film according to claim 7 using the coating liquid for forming an oxide, thereby forming the gate insulating layer.

* * * * *